(12) United States Patent
Koshikawa et al.

(10) Patent No.: US 9,093,625 B2
(45) Date of Patent: Jul. 28, 2015

(54) CURABLE COMPOSITION FOR ENCAPSULATING OPTICAL SEMICONDUCTOR AND OPTICAL SEMICONDUCTOR APPARATUS USING THE SAME

(71) Applicant: SHIN-ETSU CHEMICAL CO., LTD., Tokyo (JP)

(72) Inventors: Hidenori Koshikawa, Annaka (JP); Mikio Shiono, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 128 days.

(21) Appl. No.: 13/894,849

(22) Filed: May 15, 2013

(65) Prior Publication Data

US 2013/0320392 A1 Dec. 5, 2013

(30) Foreign Application Priority Data

Jun. 5, 2012 (JP) ................................ 2012-128330
Dec. 12, 2012 (JP) ................................ 2012-271584

(51) Int. Cl.

| | |
|---|---|
| *C08G 77/08* | (2006.01) |
| *H01L 33/56* | (2010.01) |
| *C09J 183/04* | (2006.01) |
| *C08L 71/02* | (2006.01) |
| *C08L 83/04* | (2006.01) |
| *H01L 23/29* | (2006.01) |
| *C08G 77/12* | (2006.01) |
| *C08G 77/20* | (2006.01) |
| *C08G 77/24* | (2006.01) |

(52) U.S. Cl.
CPC ................ *H01L 33/56* (2013.01); *C08L 71/02* (2013.01); *C08L 83/04* (2013.01); *C09J 183/04* (2013.01); *C08G 77/12* (2013.01); *C08G 77/20* (2013.01); *C08G 77/24* (2013.01); *H01L 23/296* (2013.01); *H01L 2924/0002* (2013.01)

(58) Field of Classification Search
CPC ........ C09J 183/04; C08L 71/02; C08L 83/04; C08G 77/12; C08G 77/20; C08G 77/24; H01L 33/56; H01L 23/296; H01L 2924/0002; H01L 2924/2924; H01L 2924/00
USPC .......................................... 528/42, 31, 32, 15
See application file for complete search history.

(56) References Cited

U.S. PATENT DOCUMENTS

| | | | |
|---|---|---|---|
| 5,656,711 A | 8/1997 | Fukuda et al. | |
| 5,665,846 A | 9/1997 | Sato et al. | |
| 6,417,311 B1 | 7/2002 | Fukuda et al. | |
| 7,851,066 B2 * | 12/2010 | Yamaguchi et al. | 428/447 |
| 8,860,076 B2 * | 10/2014 | Koshikawa et al. | 257/100 |
| 2008/0289760 A1 | 11/2008 | Koshikawa et al. | |
| 2009/0284149 A1 | 11/2009 | Koshikawa et al. | |
| 2009/0292096 A1 * | 11/2009 | Fukuda et al. | 528/31 |
| 2011/0178263 A1 * | 7/2011 | Koshikawa et al. | 528/15 |
| 2012/0123049 A1 * | 5/2012 | Koshikawa et al. | 524/588 |

FOREIGN PATENT DOCUMENTS

| | | |
|---|---|---|
| JP | B2-2990646 | 12/1999 |
| JP | B2-3239717 | 12/2001 |
| JP | B2-3567973 | 9/2004 |
| JP | A-2009-277887 | 11/2009 |

OTHER PUBLICATIONS

Extended European Search Report issued in European Application No. 13002871.5 dated Sep. 4, 2013.

\* cited by examiner

*Primary Examiner* — Margaret Moore
(74) *Attorney, Agent, or Firm* — Oliff PLC

(57) ABSTRACT

The curable composition for encapsulating an optical semiconductor includes, a linear polyfluoro compound, a cyclic organosiloxane having a SiH group and a fluorine-containing organic group, and/or an organo hydrogen siloxane having a SiH group and a fluorine-containing organic group, a platinum group metal catalyst, a cyclic organosiloxane having a SiH group, a fluorine-containing organic group and an epoxy group, and a cyclic organopolysiloxane having a monovalent unsaturated hydrocarbon group and a fluorine-containing organic group, and a hardness of the cured product obtained by curing is 30 to 80 by Type A durometer regulated by HS K6253-3. The present invention provides a curable composition for encapsulating an optical semiconductor which gives a cured product excellent in impact resistance and adhesiveness, and an optical semiconductor apparatus in which an optical semiconductor device is encapsulated by a cured product obtained by curing the curable composition for encapsulating an optical semiconductor.

25 Claims, 2 Drawing Sheets

CURABLE COMPOSITION FOR ENCAPSULATING OPTICAL SEMICONDUCTOR AND OPTICAL SEMICONDUCTOR APPARATUS USING THE SAME

BACKGROUND OF THE INVENTION

1. Field of the Invention

The present invention relates to a curable composition for encapsulating an optical semiconductor and an optical semiconductor apparatus using the same.

2. Description of the Related Art

It has heretofore been proposed, as a curable composition, a cured product which is well-balanced in the properties of heat resistance, chemical resistance, solvent resistance, mold releasability, water repellency, oil repellency and low temperature characteristics can be obtained from a composition comprising a linear fluoropolyether compound having at least two alkenyl groups in the molecule and a perfluoropolyether structure in the main chain, a fluorine-containing organo hydrogen siloxane having two or more hydrogen atoms directly bonded to a silicon atom in the molecule and a platinum group compound (Patent Document 1).

Moreover, it has been also proposed a composition to which self-adhesiveness is provided to a metal or plastic substrate by adding an organopolysiloxane having a hydrosilyl group and an epoxy group and/or a trialkoxysilyl group to the composition (Patent Document 2).

Furthermore, it has been proposed a composition in which adhesiveness to various substrates, particularly to a polyphenylene sulfide resin (PPS) or a polyamide resin is improved by adding a carboxylic acid anhydride to the above-mentioned composition (Patent Document 3). In addition, in Patent Document 4, it has been proposed a composition which can prevent from lowering in brightness even in the presence of a corrosive acidic gas or an alkaline gas.

However, among the cured products obtained by curing the actually prepared compositions of the prior art, when the material having a Type A durometer hardness regulated by JIS K6253-3 of as low as 20 or so is used as an encapsulating agent of a light emitting diode (in the following, it is referred to as "LED" otherwise specifically mentioned), there were cases where impact resistance as an encapsulating agent was insufficient. For example, when the optical semiconductor apparatuses in which the LED is encapsulated by the cured product in bulk are to be arranged to a certain direction and a posture by using a bowl type vibration parts feeder, the problem frequently occurred that a bonding wire connecting the LED chip and the electrode had been disconnected by the impact due to collision of the optical semiconductor apparatuses to each other.

On the other hand, when the hardness of the cured product is heightened to improve the impact resistance, the problem was generated that the adhesiveness of the cured product to the package material of the LED, particularly to a polyphthalamide (PPA) which is a representative material thereof was insufficient.

PRIOR ART REFERENCES

Patent Documents

[Patent Document 1] JP Patent No. 2990646
[Patent Document 2] JP Patent No. 3239717
[Patent Document 3] JP Patent No. 3567973
[Patent Document 4] JP 2009-277887

SUMMARY OF THE INVENTION

The present invention has been accomplished in view of the above-mentioned circumstance, and an object thereof is to provide a curable composition for encapsulating an optical semiconductor which gives a cured product excellent in impact resistance and having good adhesiveness, and an optical semiconductor apparatus in which an optical semiconductor device is encapsulated by a cured product obtained by curing the curable composition for encapsulating an optical semiconductor.

To solve the above-mentioned problems, according to the present invention, it is provided a curable composition for encapsulating an optical semiconductor comprising (A) 100 parts by mass of a linear polyfluoro compound represented by the following formula (1),

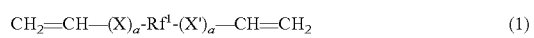

$$CH_2=CH-(X)_a-Rf^1-(X')_a-CH=CH_2 \quad (1)$$

wherein X is a group represented by any one of $-CH_2-$, $-CH_2O-$, $-CH_2OCH_2$ and $-Y-NR^1-CO-$;

where Y represents $-CH_2-$ or an o-, m- or p-dimethylsilylphenylene group represented by the following structural formula (2),

(2)

and $R^1$ represents a hydrogen atom, or an unsubstituted or substituted monovalent hydrocarbon group, X' is a group represented by any one of $-CH_2-$, $-OCH_2-$, $-CH_2OCH_2-$ and $-CO-NR^1-Y'-$;

where Y' is a group represented by any one of $-CH_2-$ or an o-, m- or p-dimethylsilylphenylene group represented by the following structural formula (3),

(3)

and $R^1$ represents the same group as mentioned above; "a" represents independently 0 or 1; and $Rf^1$ represents a divalent perfluoropolyether group represented by the following formula (4) or (5),

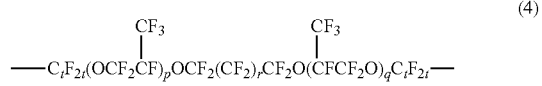

$$-C_tF_{2t}(OCF_2CF)_pOCF_2(CF_2)_rCF_2O(CFCF_2O)_qC_tF_{2t}- \quad (4)$$

wherein "p" and "q" represent each an integer of 1 to 150, and an average of the sum of "p" and "q" represents 2 to 300; "r" represents an integer of 0 to 6; and "t" is 2 or 3,

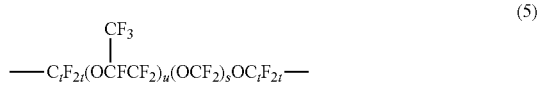

(5)

wherein "u" represents an integer of 1 to 300; "s" represents an integer of 1 to 80; and "t" represents the same as defined above, (B) a cyclic organopolysiloxane represented by the following formula (6), having a hydrogen atom directly bonded to a silicon atom, and a monovalent perfluoroalkyl group or a monovalent perfluorooxyalkyl group each bonded to a silicon atom through a divalent hydrocarbon group which may contain an oxygen atom or a nitrogen atom in the molecule, and/or an organo hydrogen siloxane represented by the following formula (36), having a hydrogen atom directly bonded to a silicon atom, and a monovalent perfluoroalkyl group or a monovalent perfluorooxyalkyl group each bonded to a silicon atom through a divalent hydrocarbon group which may contain an oxygen atom or a nitrogen atom in the molecule,

(6)

wherein "w" represents an integer of 3 to 6; "v" represents an integer of 1 to 4; w+v represents an integer of 4 to 10; $R^2$ represents a substituted or unsubstituted monovalent hydrocarbon group; and A represents a monovalent perfluoroalkyl group or a monovalent perfluorooxyalkyl group each bonded to the silicon atom through a divalent hydrocarbon group which may contain an oxygen atom or a nitrogen atom,

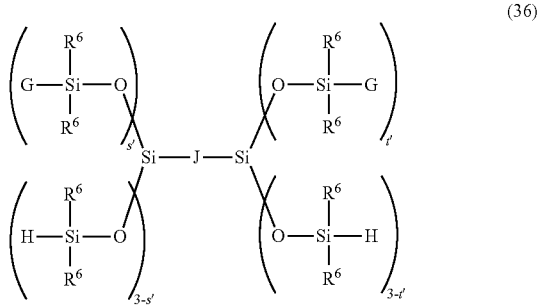

(36)

wherein J represents a divalent perfluoroalkylene group or a divalent perfluorooxyalkylene group each bonded to a silicon atom through an oxygen atom an alkylene group or a divalent hydrocarbon group which may contain an oxygen atom or a nitrogen atom; G independently represents a monovalent perfluoroalkyl group or a monovalent perfluorooxyalkyl group each bonded to a silicon atom through a divalent hydrocarbon group which may contain an oxygen atom or a nitrogen atom; and $R^6$ independently represents a substituted or unsubstituted monovalent hydrocarbon group; "s'" represents 0 or an integer of 1 to 3; "t'" represents 0 or an integer of 1 to 3; and s'+t' represents an integer of 1 to 5;

(C) 0.1 to 500 ppm of a platinum group metal catalyst in terms of a platinum group metal atom, (D) 0.10 to 10.0 parts by mass of a cyclic organopolysiloxane represented by the following formula (7), having a hydrogen atom directly bonded to a silicon atom, a monovalent perfluoroalkyl group or a monovalent perfluorooxyalkyl group each bonded to a silicon atom through a divalent hydrocarbon group which may contain an oxygen atom or a nitrogen atom, and an epoxy group bonded to a silicon atom through a divalent hydrocarbon group which may contain an oxygen atom in the molecule,

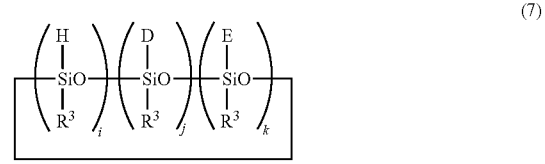

(7)

wherein "i" represents an integer of 1 to 4; "j" represents an integer of 1 to 4; "k" represents an integer of 1 to 6; i+j+k represents an integer of 4 to 10; $R^3$ represents a substituted or unsubstituted monovalent hydrocarbon group; D represents a monovalent perfluoroalkyl group or a monovalent perfluorooxyalkyl group each bonded to a silicon atom through a divalent hydrocarbon group which may contain an oxygen atom or a nitrogen atom; and E represents an epoxy group bonded to a silicon atom through a divalent hydrocarbon group which may contain an oxygen atom; and (E) 0.10 to 70.0 parts by mass of a cyclic organopolysiloxane represented by the following formula (8), having a monovalent unsaturated hydrocarbon group directly bonded to a silicon atom, and a monovalent perfluoroalkyl group or a monovalent perfluorooxyalkyl group each bonded to a silicon atom through a divalent hydrocarbon group which may contain an oxygen atom or a nitrogen atom in the molecule,

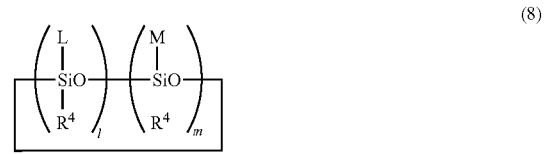

(8)

wherein "l" represents an integer of 1 to 4; "m" represents an integer of 3 to 6; l-1-m represents an integer of 4 to 10; $R^4$ represents a substituted or unsubstituted monovalent hydrocarbon group; L represents a monovalent perfluoroalkyl group or a monovalent perfluorooxyalkyl group each bonded to a silicon atom through a divalent hydrocarbon group which may contain an oxygen atom or a nitrogen atom; and M represents a monovalent unsaturated hydrocarbon group directly bonded to a silicon atom, wherein the above-mentioned Component (B) is contained in such an amount that the hydrogen atom directly bonded to a silicon atom becomes 0.1 to 2.0 mole based on 1 mole of the sum of the alkenyl group of the above-mentioned Component (A) and the monovalent unsaturated hydrocarbon group of the above-mentioned Component (E), and a hardness of a cured product obtained by curing the composition is a value of 30 to 80 by Type A durometer regulated by JIS K6253-3.

Such a curable composition for encapsulating an optical semiconductor containing all of the above mentioned Components (A) to (E) which is an addition curable fluoropolyether type curable composition having the hardness of the cured product within the above-mentioned range has good impact resistance and adhesiveness.

Moreover, it is preferred that the composition further comprises, as Component (F), 0.010 to 10.0 parts by mass of a cyclic organopolysiloxane represented by the following formula (9), having a hydrogen atom directly bonded to a silicon atom, a monovalent perfluoroalkyl group or a monovalent perfluorooxyalkyl group each bonded to a silicon atom through a divalent hydrocarbon group which may contain an oxygen atom or a nitrogen atom, and a cyclic carboxylic acid anhydride residue bonded to a silicon atom through a divalent hydrocarbon group in the molecule,

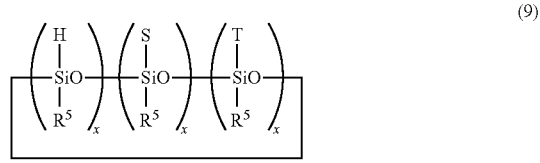

wherein "x" represents an integer of 1 to 6; "y" represents an integer of 1 to 4; "z" represents an integer of 1 to 4; x+y+z represents an integer of 4 to 10; $R^5$ represents a substituted or unsubstituted monovalent hydrocarbon group; S represents a monovalent perfluoroalkyl group or a monovalent perfluorooxyalkyl group each bonded to a silicon atom through a divalent hydrocarbon group which may contain an oxygen atom or a nitrogen atom; and T represents a cyclic carboxylic acid anhydride residue bonded to a silicon atom through a divalent hydrocarbon group.

When the curable composition for encapsulating an optical semiconductor contains the above-mentioned Component (F) in addition to the above-mentioned Component (A) to Component (E), it gives a cured product showing better adhesiveness to various substrates, particularly to a polyphthalamide (PPA). Accordingly, the cured product of the above-mentioned curable composition for encapsulating an optical semiconductor is suitable for an encapsulating agent of an optical semiconductor device, particularly to an encapsulating agent for protecting a LED.

In addition, the above-mentioned curable composition for encapsulating an optical semiconductor preferably has a viscosity regulated by JIS K7117-1 at 23° C. of 100 to 50,000 mPa·s.

When the viscosity is 100 mPa·s or more, it is preferred since there is no fear of becoming difficult to control the dispenser for discharging a predetermined amount into the LED package due to higher fluidity, and when it is 50,000 mPa·s or less, it is preferred since there is no fear of lowering productivity by taking a time for leveling the curable composition for encapsulating an optical semiconductor in the LED package.

Also, a refractive index of the cured product obtained by curing the above-mentioned curable composition for encapsulating an optical semiconductor at 25° C. and 589 nm (D line of sodium) is preferably 1.30 or more and less than 1.40.

If the refractive index is within the above range, in the optical semiconductor apparatus in which the optical semiconductor device is encapsulated by the cured product obtained by curing the composition of the present invention, it is preferred since there is no fear of lowering the efficiency of taking the light emitted from the LED to outside by the design of the optical semiconductor apparatus.

The above-mentioned Component (A) is preferably a material represented by the following formula (10),

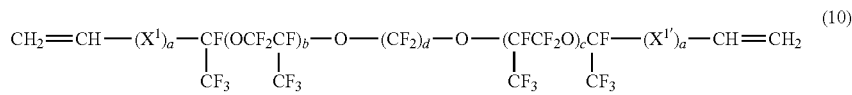

wherein $X^1$ has the same meaning as the above-mentioned X; and $X^{1'}$ has the same meaning as the above-mentioned X'; "a" independently represents 0 or 1; "d" represents an integer of 2 to 6; "b" and "c" represent each an integer of 1 to 150; and b+c (average)=2 to 300.

Such a compound is more preferred as the linear polyfluoro compound.

The above-mentioned alkenyl group content of the linear polyfluoro compound of Component (A) is preferably 0.0050 to 0.100 mole/100 g.

When the alkenyl group content of Component (A) is 0.0050 mole/100 g or more, it is preferred since cross-linking degree is sufficient and there is no fear of causing curing failure, and when the alkenyl group content is 0.100 mole/100 g or less, it is preferred since there is no fear of impairing mechanical characteristics of the cured product as a rubbery elastomer.

The monovalent perfluoroalkyl group or the monovalent perfluorooxyalkyl group possessed by each of the cyclic organopolysiloxanes of the above-mentioned Component (B), Component (D), Component (E) and Component (F) is preferably that represented by the following formula (11) or the following formula (12), respectively,

wherein "f" represents an integer of 1 to 10.

wherein "g" represents an integer of 1 to 10.

Thus, the monovalent perfluoroalkyl group or the monovalent perfluorooxyalkyl group is preferably that represented by the above-mentioned formula (11) or represented by the above-mentioned formula (12), respectively.

The present invention is to provide an optical semiconductor apparatus having an optical semiconductor device, and a cured product obtained by curing the above-mentioned curable composition for encapsulating an optical semiconductor for encapsulating the optical semiconductor device.

The curable composition for encapsulating an optical semiconductor of the present invention can provide a cured product showing good impact resistance and good adhesiveness to the various kinds of substrates, particularly to the polyphthalamide (PPA), so that the optical semiconductor apparatuses in which the optical semiconductor devices are encapsulated by the cured product are, for example, to be arranged to a certain direction and a posture by using a bowl type vibration parts feeder in the manufacturing steps, even when the optical semiconductor apparatuses are collided to each other, damages of the parts such as disconnection of the bonding wire difficultly occurs, and further, peeling between the cured product and the package material of the optical semiconductor apparatus difficultly occurs, so that yield and productivity can be improved.

The above-mentioned optical semiconductor device is preferably a light emitting diode.

Thus, the cured product of the curable composition for encapsulating an optical semiconductor of the present invention is suitable as an encapsulating agent particularly for protecting a light emitting diode.

In the curable composition for encapsulating an optical semiconductor of the present invention, by using the above-mentioned Components (A) to (E), and further Component (F), if necessary, in combination, the cured product has a suitable hardness whereby it has good impact resistance, and accordingly, the optical semiconductor apparatus in which an optical semiconductor device has been encapsulated can be manufactured without damaging the parts such as disconnection of the bonding wire. Moreover, the curable composition for encapsulating an optical semiconductor shows good adhesiveness to various kinds of substrates, in particular to a polyphthalamide (PPA), so that it becomes a suitable material for protecting the LED as an encapsulating agent.

DETAILED DESCRIPTION OF THE PREFERRED EMBODIMENTS

Figure 1:
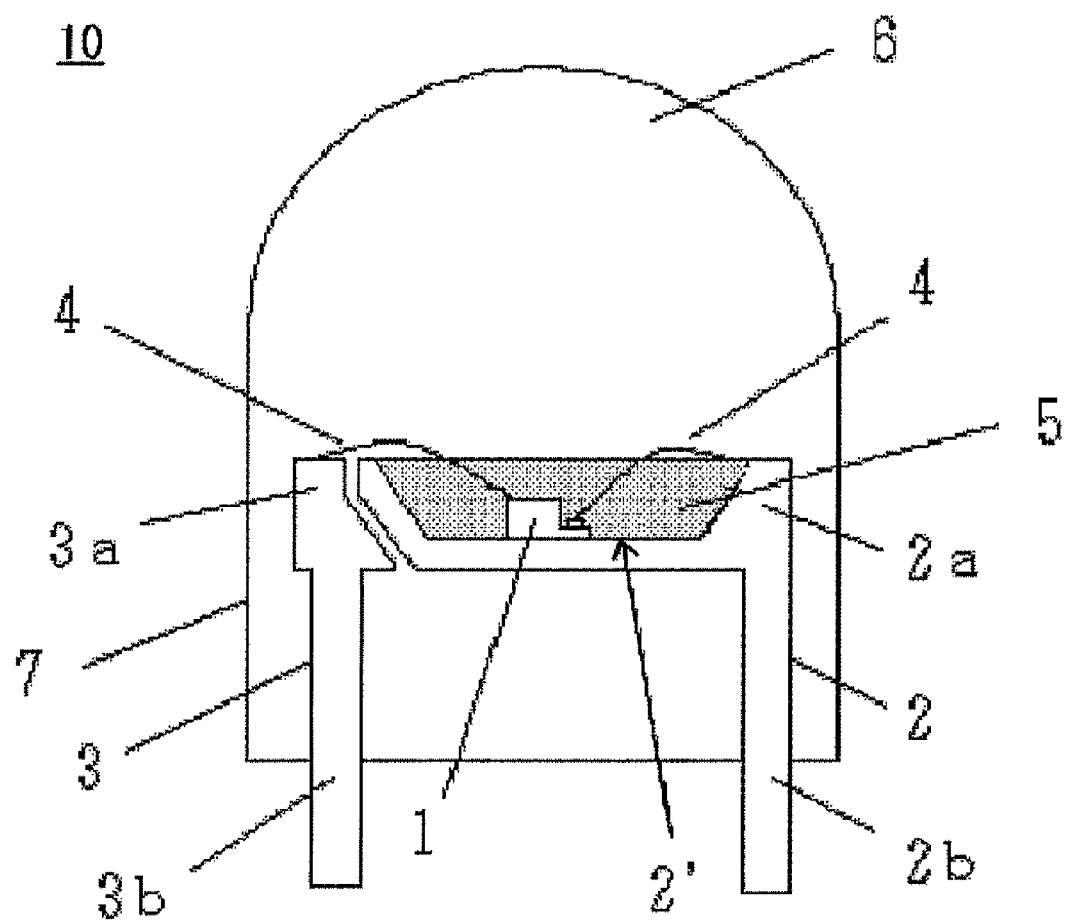
FIG. 1 is a schematic drawing of a cross-sectional view showing one example of the optical semiconductor apparatus of the present invention.

In the following, the present invention will be explained in more detail.

As mentioned above, it has been required to obtain a curable composition for encapsulating an optical semiconductor which gives a cured product having good impact resistance, and having good adhesiveness to various substrates, particularly to PPA, and an optical semiconductor apparatus wherein an optical semiconductor device is encapsulated by the cured product obtained by curing the composition.

The present inventors have intensively studied to accomplish the above-mentioned objects, and as a result, they have found that when the composition containing the following Components (A) to (E), and further Component (F) is used, it becomes a curable composition for encapsulating an optical semiconductor having a suitable hardness, and giving a cured product having good impact resistance and good adhesiveness, as an effect of using the following Components (A) to (E), and further Component (F), if necessary, in combination, whereby the present invention has been accomplished. In the following, the present invention is explained in more detail.

[Component (A)]

Component (A) of the present invention is a linear polyfluoro compound represented by the following formula (1),

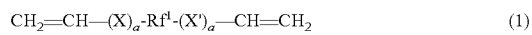

$$CH_2=CH-(X)_a\text{-}Rf^1\text{-}(X')_a-CH=CH_2 \qquad (1)$$

wherein X is a group represented by any one of $-CH_2-$, $-CH_2O-$, $-CH_2OCH_2-$ and $-Y-NR^1-CO-$;

where Y represents $-CH_2-$ or an o-, m- or p-dimethylsilylphenylene group represented by the following structural formula (2),

and $R^1$ represents a hydrogen atom, or unsubstituted or substituted monovalent hydrocarbon group;

X' is a group represented by any one of $-CH_2-$, $-OCH_2-$, $-CH_2OCH_2-$ and $-CO-NR^1-Y'-$, where Y' represents $-CH_2-$ or an o-, m- or p-dimethylsilylphenylene group represented by the following structural formula (3),

and $R^1$ represents the same group as mentioned above; "a" represents independently 0 or 1; and $Rf^1$ represents a divalent perfluoropolyether group represented by the following formula (4) or (5),

wherein "p" and "q" represent each an integer of 1 to 150; and an average of the sum of "p" and "q" represents 2 to 300; "r" represents an integer of 0 to 6; and "t" represents 2 or 3,

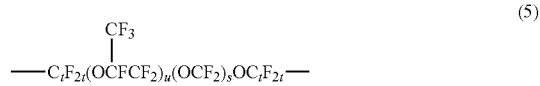

wherein "u" represents an integer of 1 to 300; "s" represents an integer of 1 to 80; and "t" has the same meaning as defined above.

Here, $R^1$ is preferably, other than the hydrogen atom, a monovalent hydrocarbon group having 1 to 12 carbon atoms, particularly 1 to 10 carbon atoms, more specifically, an alkyl group such as a methyl group, an ethyl group, a propyl group, a butyl group, a hexyl group, a cyclohexyl group and an octyl group; an aryl group such as a phenyl group and a tolyl group; an aralkyl group such as a benzyl group and a phenylethyl group; and a substituted monovalent hydrocarbon group in which a part or whole of the hydrogen atoms of the above-mentioned groups is/are substituted by a halogen atom such as fluorine, etc.

$Rf^1$ in the above-mentioned formula (1) has a divalent perfluoropolyether structure represented by the following formula (4) or (5),

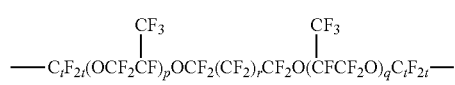
(4)

wherein "p" and "q" represent each an integer of 1 to 150, preferably each an integer of 1 to 100; and an average of the sum of "p" and "q" represents 2 to 300, preferably 2 to 200, more preferably 10 to 150; "r" represents an integer of 0 to 6; and "t" represents 2 or 3,

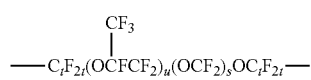
(5)

wherein "u" represents an integer of 1 to 300, preferably an integer of 1 to 200, more preferably an integer of 10 to 150; "s" represents an integer of 1 to 80, preferably an integer of 1 to 50, "t" has the same meaning as defined above.

Preferred examples of the $Rf^1$ group may be mentioned, for example, those represented by the following formulae (i) to (iii), and more preferably a divalent group having the structure of the formula (i),

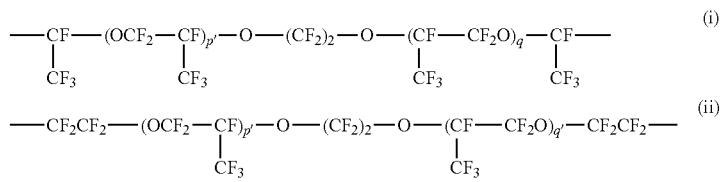
(i)
(ii)

wherein "p'" and "q'" represent each an integer of 1 to 150, preferably an integer of 1 to 100; p'+q' (average)=2 to 300, preferably 2 to 200, more preferably 10 to 150,

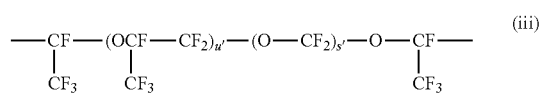
(iii)

wherein "u'" represents an integer of 1 to 300, preferably an integer of 1 to 200, more preferably an integer of 10 to 150; "s'" represents an integer of 1 to 80, preferably an integer of 1 to 50, more preferably an integer of 1 to 30.

Preferred examples of Component (A) may be mentioned the compound represented by the following formula (10),

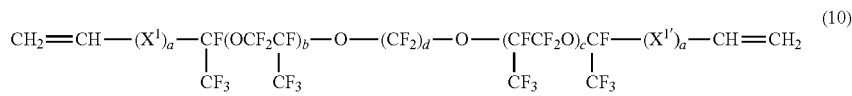
(10)

wherein $X^1$ is a group represented by the formula:

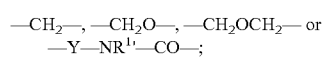

where Y represents —$CH_2$— or an o-, m- or p-dimethylsilylphenylene group represented by the following structural formula (2),

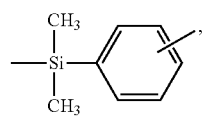
(2)

$R^{1'}$ represents a substituted or unsubstituted monovalent hydrocarbon group such as a hydrogen atom, a methyl group, a phenyl group or an allyl group;
$X^{1'}$ is a group represented by the formula: —$CH_2$—, —$OCH_2$—, —$CH_2OCH_2$— or —CO—$NR^{1'}$—Y'—;

where Y' represents —CH$_2$— or an o-, m- or p-dimethylsilylphenylene group represented by the following structural formula (3),

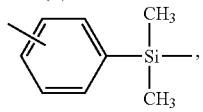
(3)

and R$^{1'}$ has the same meaning as defined above; "a" represents independently 0 or 1; "d" represents an integer of 2 to 6; "b" and "c" represent each an integer of 1 to 150, preferably an integer of 1 to 100; and b+c (average)=2 to 300, preferably 2 to 200, more preferably 10 to 150.

Specific examples of the linear polyfluoro compound represented by the above-mentioned formula (10) may be mentioned those as mentioned by the following formulae.

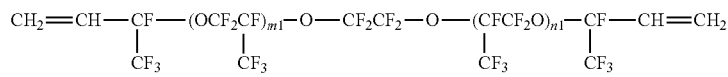

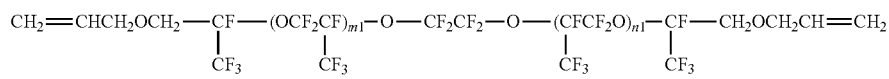

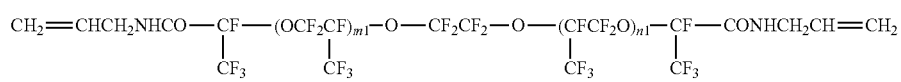

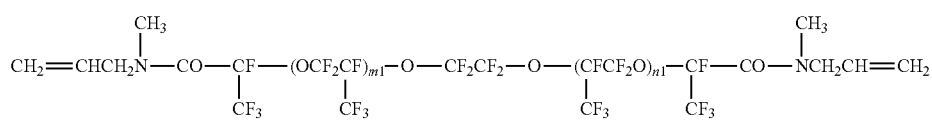

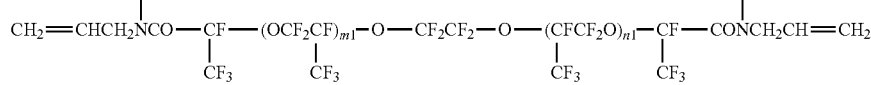

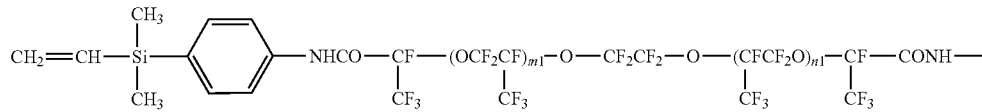

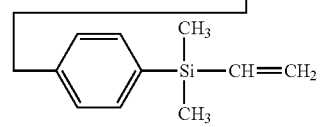

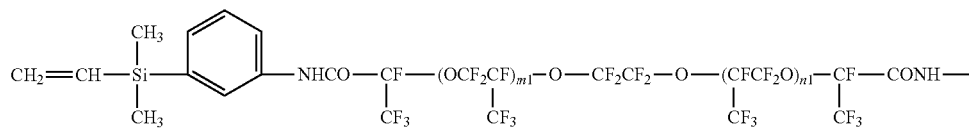

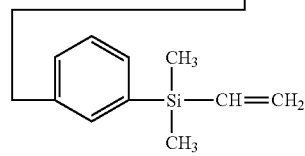

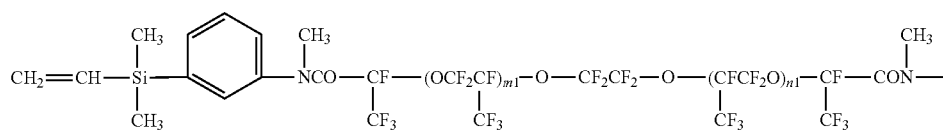

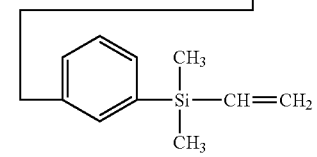

wherein "m1" and "n1" represent each an integer of 1 to 150, preferably an integer of 1 to 100; m1+n1=2 to 300, preferably an integer satisfying 6 to 200.

An alkenyl group content contained in the linear fluoropolyether compound represented by the above-mentioned formula (1) is preferably 0.0050 to 0.100 mole/100 g, more preferably 0.0060 to 0.050 mole/100 g. When the alkenyl group content contained in the linear polyfluoro compound is 0.0050 mole/100 g or more, it is preferred since the cross-linking degree becomes sufficient and there is no possibility of causing curing deficiency, and when the alkenyl group content is 0.100 mole/100 g or less, it is preferred since there is no fear that the mechanical characteristics of the cured product as a rubbery elastomer are impaired.

Also, a viscosity (at 23° C.) of the linear polyfluoro compound represented by the above-mentioned formula (1) is desirably in the range of 100 to 100,000 mPa·s, more preferably 500 to 50,000 mPa·s according to the viscosity measurement regulated by JIS K7117-1, for using the composition of the present invention as an encapsulating agent of the LED.

These linear polyfluoro compounds may be used alone or two or more kinds in combination.

[Component (B)]

Component (B) is a cyclic organopolysiloxane having a hydrogen atom directly bonded to a silicon atom and a monovalent perfluoroalkyl group or a monovalent perfluorooxyalkyl group each bonded to a silicon atom through a divalent hydrocarbon group which may contain an oxygen atom or a nitrogen atom in one molecule represented by the following formula (6), and/or an organo hydrogen siloxane having a hydrogen atom directly bonded to a silicon atom and a monovalent perfluoroalkyl group or a monovalent perfluorooxyalkyl group each bonded to a silicon atom through a divalent hydrocarbon group which may contain an oxygen atom or a nitrogen atom in one molecule represented by the following formula (36), and acts as a cross-linking agent of the above-mentioned Component (A),

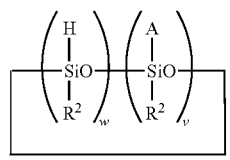
(6)

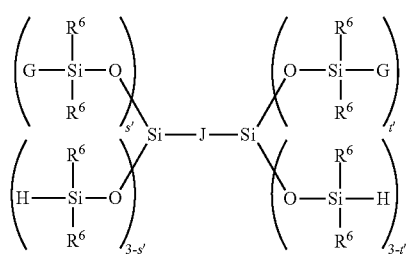
(36)

In the above-mentioned formula (6), "w" represents an integer of 3 to 6, preferably an integer of 3 to 5, "v" represents an integer of 1 to 4, preferably an integer of 1 to 3, and w+v represents an integer of 4 to 10, preferably an integer of 4 to 8.

$R^2$ is a substituted or unsubstituted monovalent hydrocarbon group, and the same group as the substituted or unsubstituted monovalent hydrocarbon group of $R^1$ mentioned above may be mentioned.

Further, A is a monovalent perfluoroalkyl group or a monovalent perfluorooxyalkyl group each bonded to a silicon atom through a divalent hydrocarbon group which may contain an oxygen atom or a nitrogen atom. These are groups to be incorporated in the viewpoints of compatibility with Component (A), dispersibility and uniformity after curing.

In the above-mentioned formula (36), "s'" represents 0 or an integer of 1 to 3, "t'" represents 0 or an integer of 1 to 3, and s'+t' represents an integer of 1 to 5.

$R^6$ is independently a substituted or unsubstituted monovalent hydrocarbon group, and the same group as the substituted or unsubstituted monovalent hydrocarbon group of $R^1$ mentioned above may be mentioned.

Moreover, J represents a divalent perfluoroalkylene group or a divalent perfluorooxyalkylene group each bonded to a silicon atom through an oxygen atom, or a divalent hydrocarbon group which may contain an oxygen atom or a nitrogen atom.

G represents independently a monovalent perfluoroalkyl group or a monovalent perfluorooxyalkyl group each bonded to a silicon atom through a divalent hydrocarbon group which may contain an oxygen atom or a nitrogen atom. G is a group to be incorporated in the viewpoints of compatibility with Component (A), dispersibility and uniformity after curing.

The monovalent perfluoroalkyl group or a monovalent perfluorooxyalkyl group may be mentioned the group represented by the following formulae (11) and (12),

(11)

wherein "f" represents an integer of 1 to 10, preferably an integer of 3 to 7,

(12)

wherein "g" represents an integer of 1 to 10, preferably 2 to 8.

The above-mentioned divalent perfluoroalkylene group or divalent perfluorooxyalkylene group may be mentioned the group represented by the following formulae (37) to (39),

(37)

wherein "g'" represents an integer of 1 to 20, preferably an integer of 2 to 10,

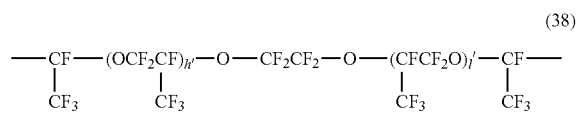
(38)

wherein "h'" and "i'" represent each an integer of 1 or more, preferably an integer of 1 to 20, and an average of the sum of "h'" and "i'" represents 2 to 40, preferably 2 to 20,

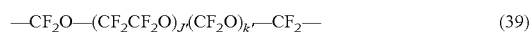
(39)

wherein "j'" and "k'" represent each an integer of 1 or more, preferably an integer of 1 to 20, and an average of the sum of "j'" and "k'" represents 2 to 40, preferably 2 to 20.

Also, the monovalent perfluoroalkyl group or the monovalent perfluorooxyalkyl group, or the divalent hydrocarbon group which is to bond the divalent perfluoroalkylene group or the divalent perfluorooxyalkylene group and the silicon atom, and may contain an oxygen atom or a nitrogen atom shown by the above-mentioned A, J and G may be mentioned an alkylene group having 2 to 12 carbon atoms, or a group in which an ether bond, an oxygen atom, an amide bond and/or a carbonyl bond is/are interposed into the group, and more specifically mentioned, —$CH_2CH_2$—,
—$CH_2CH_2CH_2$—
—$CH_2CH_2CH_2OCH_2$—,
—$CH_2CH_2CH_2$—NH—CO—,
—$CH_2CH_2CH_2$—N(Ph)-CO— (provided that Ph is a phenyl group.),
—$CH_2CH_2CH_2$—N($CH_3$)—CO—, and
—$CH_2CH_2CH_2$—O—CO—.

Such Component (B) may be mentioned, for example, the following mentioned compounds. Incidentally, in the following formulae, "Me" represents a methyl group.

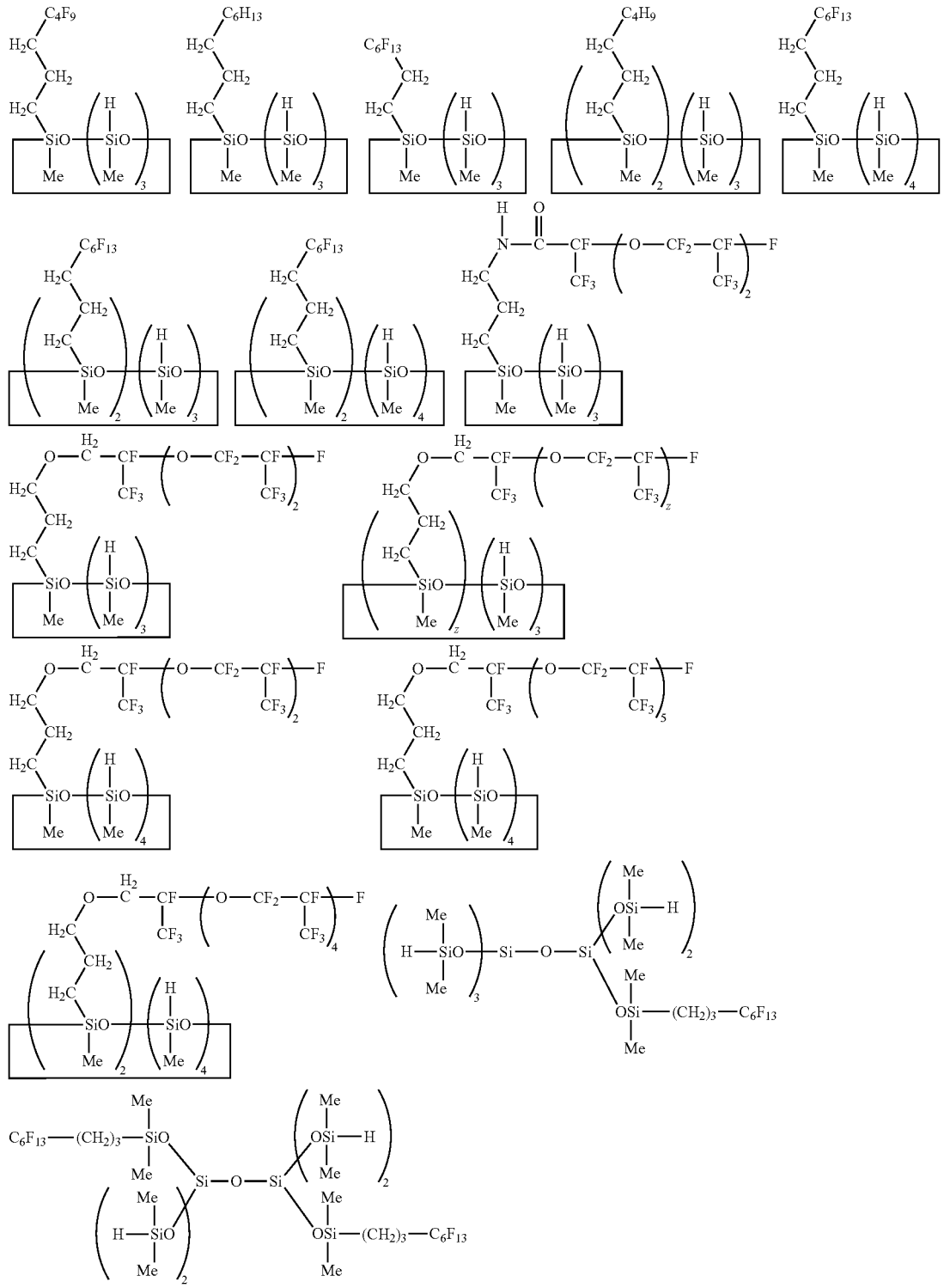

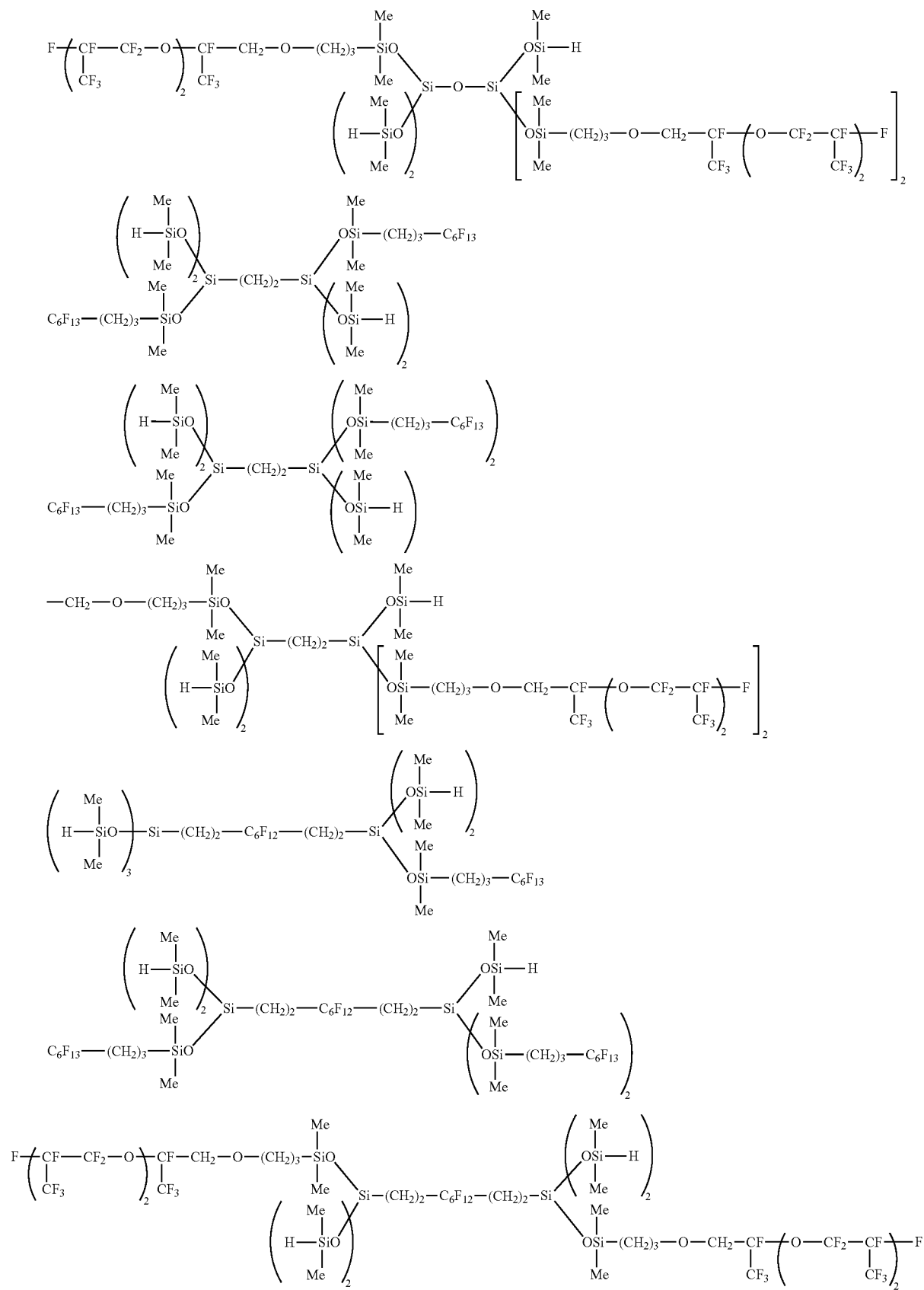

-continued

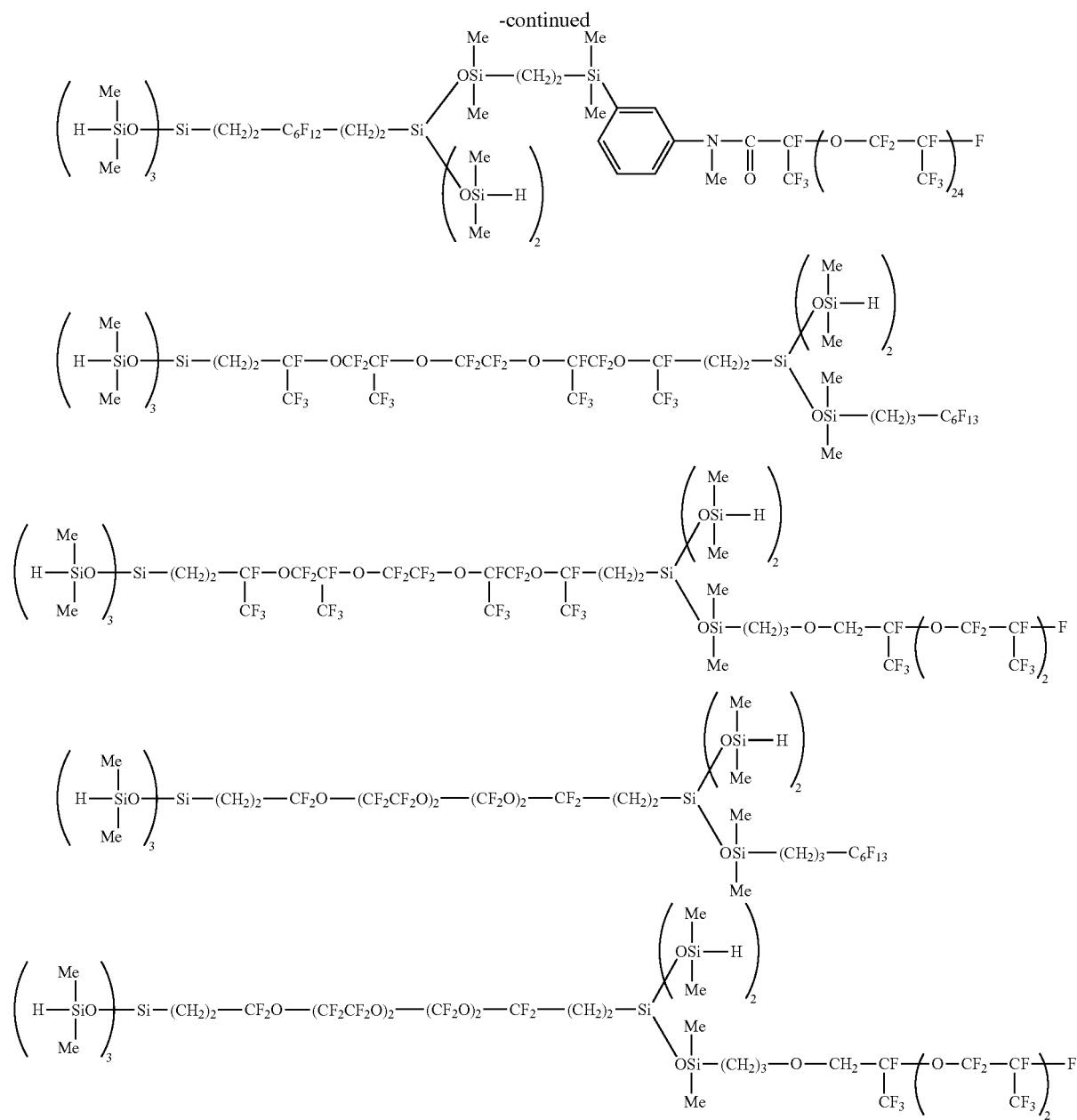

Component (B) may be used a single kind alone or may be used two or more kinds in combination.

The formulation amount of the above-mentioned Component (B) is such an amount that the SiH group (a hydrogen atom directly bonded to a silicon atom) in Component (B) becomes 0.1 to 2.0 mole, more preferably 0.5 to 1.5 mole, based on the sum of the alkenyl group contained in Component (A) and the monovalent unsaturated hydrocarbon group of the above-mentioned Component (B) as 1 mole. If the amount of the SiH group is less than 0.1 mole, cross-linking degree becomes insufficient, while if it exceeds 2.0 mole, there are fears that preservability is impaired, or heat resistance of the cured product obtained by curing is lowered.

[Component (C)]

The platinum group metal catalyst which is Component (C) of the present invention is a hydrosilylation catalyst. The hydrosilylation catalyst is a catalyst to promote the addition reaction of the alkenyl group contained in the composition, particularly the alkenyl group in Component (A) and the unsaturated hydrocarbon group in Component (B), and the SiH group contained in the composition, particularly the SiH group in Component (B). The hydrosilylation catalyst is generally a noble metal or a compound thereof, and is an expensive so that platinum or a platinum compound which can be relatively easily available is used well.

The platinum compound may be mentioned, for example, chloroplatinic acid or a complex of chloroplatinic acid and an olefin such as ethylene, etc., a complex with an alcohol or vinylsiloxane, and metallic platinum supported silica, alumina, carbon, etc. As the platinum group metal catalyst other than platinum or a compound thereof, rhodium, ruthenium, iridium or palladium series compounds have been also known, and may be exemplified by, for example, RhCl(PPh$_3$)$_3$, RhCl(CO)(PPh$_3$)$_2$, Ru$_3$(CO)$_{12}$, IrCl(CO)(PPh$_3$)$_2$, Pd(PPh$_3$)$_4$, etc. In the above formulae, "Ph" represents a phenyl group.

For using these catalysts, when it is a solid catalyst, it may be possible to use them in the solid state, but for the purpose of obtaining a more uniform cured product, it is preferred, for example, to use a material in which chloroplatinic acid or a complex is dissolved in a suitable solvent such as toluene and ethanol so as to be compatible with the linear polyfluoro compound of Component (A).

The formulation amount of Component (C) is an effective amount as the hydrosilylation catalyst, and generally 0.1 to 500 ppm, particularly preferably 0.5 to 200 ppm (in terms of a mass of the platinum group metal atom) based on the amount of Component (A), and may be optionally changed depending on the desired curing rate.

[(Component (D)]

Component (D) of the present invention is a cyclic organopolysiloxane represented by the following formula (7), and having a hydrogen atom directly bonded to a silicon atom, a monovalent perfluoroalkyl group or a monovalent perfluorooxyalkyl group each bonded to a silicon atom through a divalent hydrocarbon group which may contain an oxygen atom or a nitrogen atom, and an epoxy group bonded to a silicon atom through a divalent hydrocarbon group which may contain an oxygen atom in the molecule, and is an adhesiveness imparting agent to provide self-adhesiveness to the cured product obtained by curing the composition of the present invention.

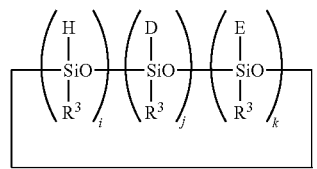

(7)

In the above-mentioned formula (7), "i" represents an integer of 1 to 6, preferably an integer of 2 to 5, "j" represents an integer of 1 to 4, preferably an integer of 1 to 3, "k" represents an integer of 1 to 4, preferably an integer of 1 to 3, and i+j+k represents an integer of 4 to 10, preferably an integer of 4 to 8.

R$^3$ is a substituted or unsubstituted monovalent hydrocarbon group, and the same group as the substituted or unsubstituted monovalent hydrocarbon group of the above-mentioned R$^1$ may be mentioned.

Further, D represents a monovalent perfluoroalkyl group or a monovalent perfluorooxyalkyl group each bonded to a silicon atom through a divalent hydrocarbon group which may contain an oxygen atom or a nitrogen atom, and the same group as the above-mentioned A may be mentioned. These are groups to be incorporated in the viewpoints of compatibility with Component (A), dispersibility and uniformity after curing.

Also, E represents an epoxy group bonded to a silicon atom through a divalent hydrocarbon group which may contain an oxygen atom, and specifically the following groups may be mentioned,

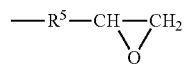

wherein R$^5$ represents a divalent hydrocarbon group having 1 to 10 carbon atoms, particularly 1 to 5 carbon atoms, into which an oxygen atom may be interposed, more specifically, there may be mentioned an alkylene group such as a methylene group, an ethylene group, a propylene group, a butylene group, a hexylene group and an octylene group; a cycloalkylene group such as a cyclohexylene group; and an oxyalkylene group such as an oxyethylene group, an oxypropylene group and an oxybutylene group.

E may be specifically exemplified by the following.

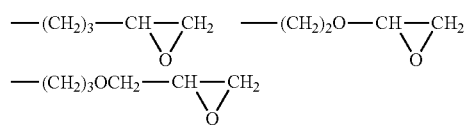

Such Component (D) may be mentioned, for example, the following mentioned compounds. Incidentally, in the following formulae, "Me" represents a methyl group.

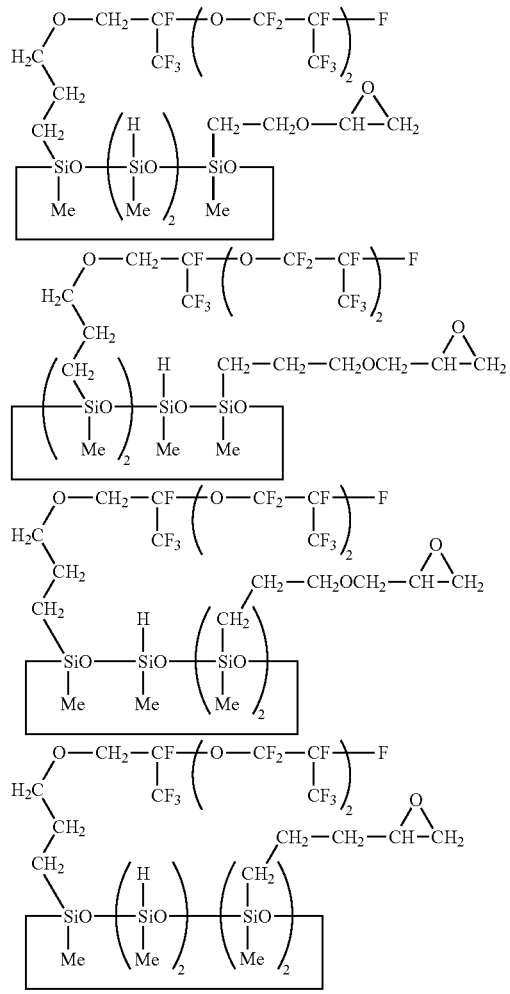

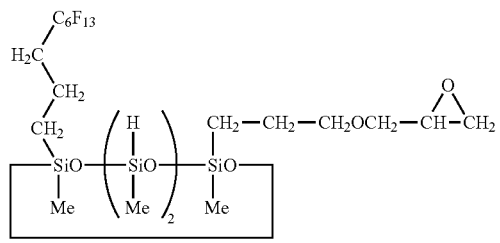

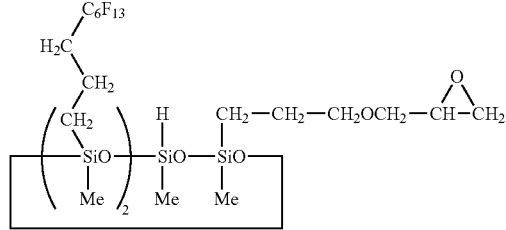

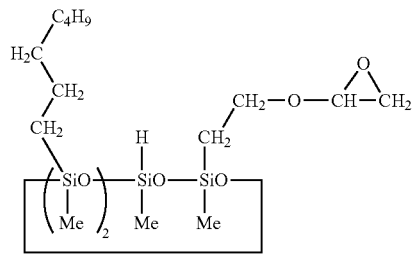

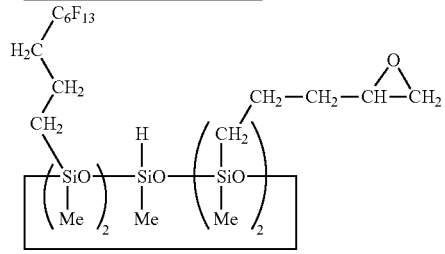

Component (D) may be used a single kind alone or may be used two or more kinds in combination. Also, the formulation amount of the Component (D) is 0.10 to 10.0 parts by mass based on 100 parts by mass of Component (A), preferably in the range of 0.50 to 8.0 parts by mass. If it is less than 0.10 part by mass, sufficient adhesiveness cannot be obtained, while if it exceeds 10.0 parts by mass, fluidity of the composition becomes worse, and the physical strength of the resulting cured product is lowered.

[Component (E)]

Component (E) of the present invention is a cyclic organopolysiloxane represented by the following formula (8), having a monovalent unsaturated hydrocarbon group directly bonded to a silicon atom, and a monovalent perfluoroalkyl group or a monovalent perfluorooxyalkyl group each bonded to a silicon atom through a divalent hydrocarbon group which may contain an oxygen atom or a nitrogen atom in the molecule, and contributes to improve hardness of the cured product obtained by curing the composition of the present invention.

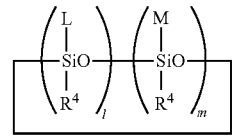

In the above-mentioned formula (8), "l" represents an integer of 1 to 4, preferably an integer of 1 to 3, a "m" represents an integer of 3 to 6, preferably an integer of 3 to 5, and l+m represents an integer of 4 to 10, preferably an integer of 4 to 8.

Also, $R^4$ is a substituted or unsubstituted monovalent hydrocarbon group, and the same group as the above-mentioned substituted or unsubstituted monovalent hydrocarbon group of $R^1$ may be mentioned.

Moreover, L represents a monovalent perfluoroalkyl group or a monovalent perfluorooxyalkyl group each bonded to a silicon atom through a divalent hydrocarbon group which may contain an oxygen atom or a nitrogen atom, and the same group as the above-mentioned A may be mentioned. These are groups to be incorporated in the viewpoints of compatibility with Component (A), dispersibility and uniformity after curing.

In addition, M represents a monovalent unsaturated linear hydrocarbon group directly bonded to a silicon atom, and specifically mentioned a vinyl group, an allyl group, a butenyl group, a hexenyl group and a decenyl group. Among these, a vinyl group or an allyl group is preferred.

Such Component (E) may be mentioned, for example, the following mentioned compounds. Incidentally, in the following formulae, "Me" represents a methyl group.

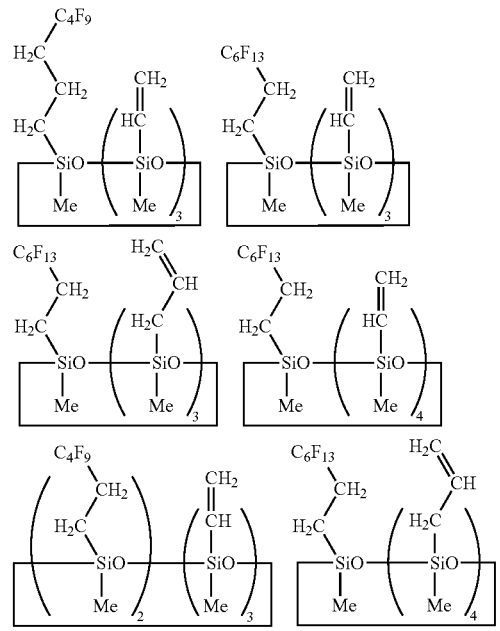

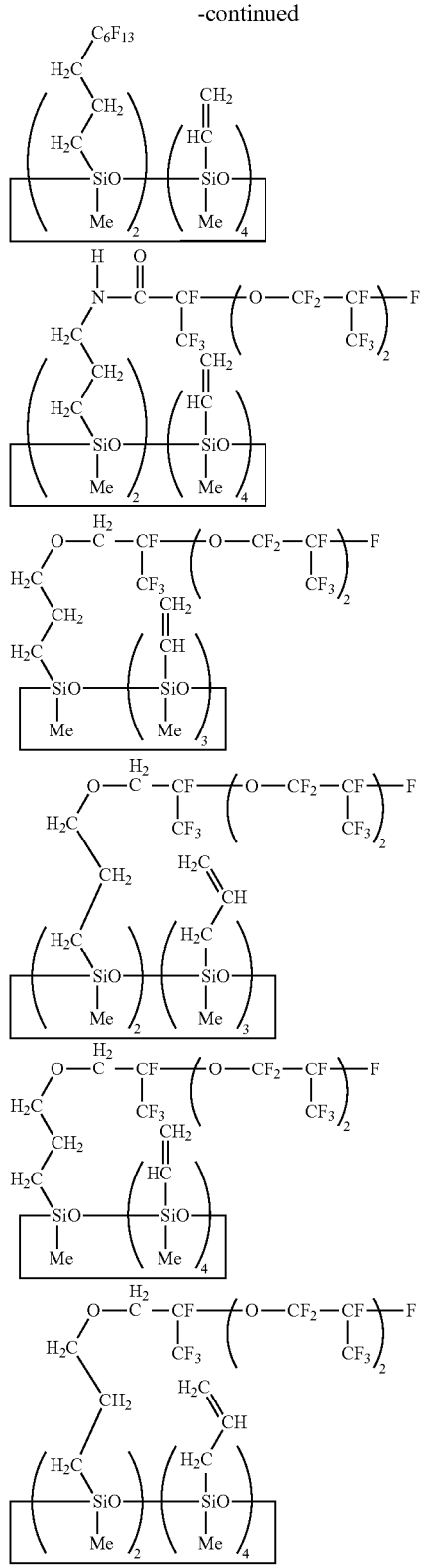

Component (E) may be used a single kind alone or may be used two or more kinds in combination. Also, the formulation amount of Component (E) is in the range of 0.10 to 70.0 parts by mass based on 100 parts by mass of Component (A), preferably 1.0 to 60.0 parts by mass. If it is less than 0.10 part by mass, an effect of improving hardness of the cured product obtained by curing the composition of the present invention cannot sufficiently be obtained, while if it exceeds 70.0 parts by mass, adhesiveness of the cured product obtained by curing the composition of the present invention to the polyphthalamide (PPA) tends to be insufficient.

[Component (F)]

The curable composition for encapsulating an optical semiconductor of the present invention preferably contains the following Component (F) as an optional component.

Component (F) of the present invention is a cyclic organopolysiloxane represented by the following formula (9), and having a hydrogen atom directly bonded to a silicon atom, a monovalent perfluoroalkyl group or a monovalent perfluorooxyalkyl group each bonded to a silicon atom through a divalent hydrocarbon group which may contain an oxygen atom or a nitrogen atom, and a cyclic carboxylic acid anhydride residue bonded to a silicon atom through a divalent hydrocarbon group in the molecule, and acts to improve an adhesion imparting ability of the above-mentioned Component (D), and to further promote expressing adhesiveness of the cured product obtained by curing the composition of the present invention.

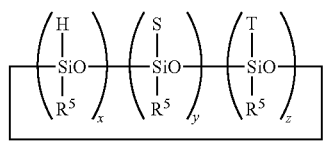

(9)

In the above-mentioned formula (9), "x" represents an integer of 1 to 6, preferably an integer of 2 to 5, "y" represents an integer of 1 to 4, preferably an integer of 1 to 3, "z" represents an integer of 1 to 4, preferably an integer of 1 to 3, and x+y+z represents an integer of 4 to 10, preferably an integer of 4 to 8.

$R^5$ is a substituted or unsubstituted monovalent hydrocarbon group, and the same group as the substituted or unsubstituted monovalent hydrocarbon group of $R^1$ may be mentioned.

Further, S represents a monovalent perfluoroalkyl group or a monovalent perfluorooxyalkyl group each bonded to a silicon atom through a divalent hydrocarbon group which may contain an oxygen atom or a nitrogen atom, and the same group as the above-mentioned A may be mentioned. These are groups to be incorporated in the viewpoints of compatibility with Component (A), dispersibility and uniformity after curing.

T represents a cyclic carboxylic acid anhydride residue bonded to a silicon atom through a divalent hydrocarbon group, and specifically the following groups may be mentioned.

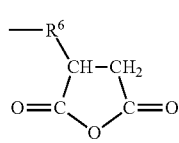

(13)

In the above-mentioned formula (13), $R^6$ represents a divalent hydrocarbon group having 1 to 15 carbon atoms, more specifically, there may be mentioned a methylene group, an ethylene group, a propylene group, a butylene group, etc., and above all, a propylene group is preferred.
Such Component (F) may be mentioned, for example, the following mentioned compounds. Incidentally, in the following formulae, "Me" represents a methyl group.
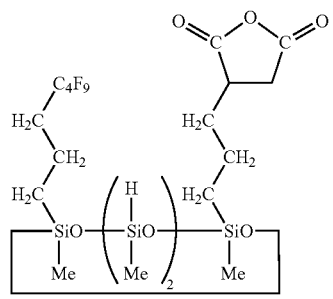
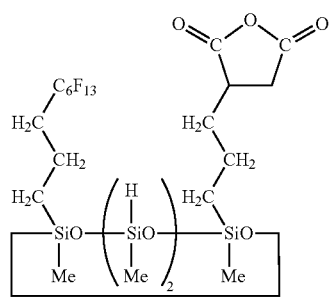
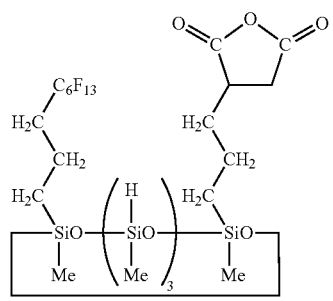
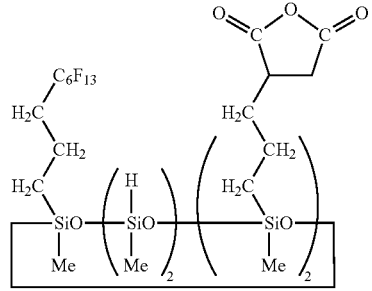
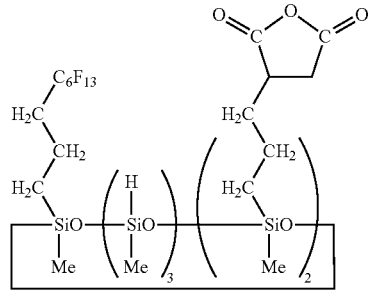
-continued
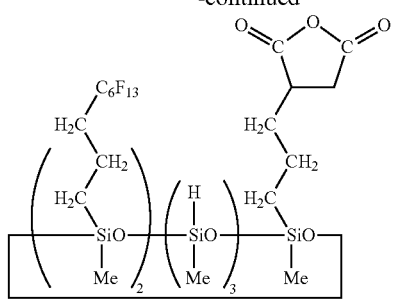
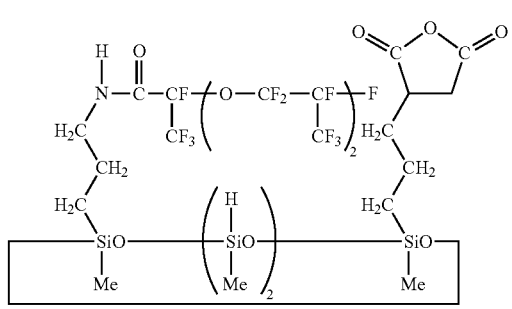
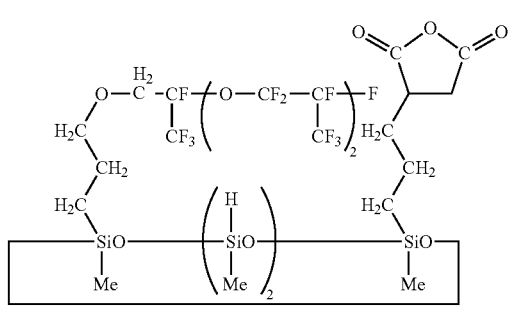
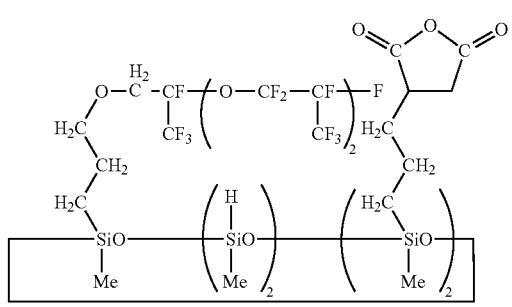
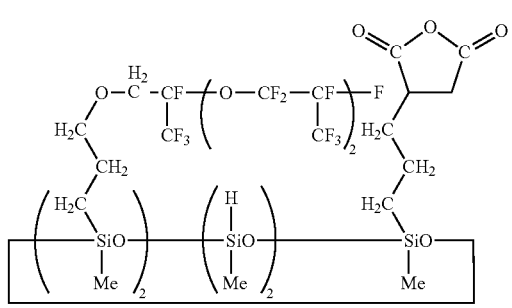

-continued

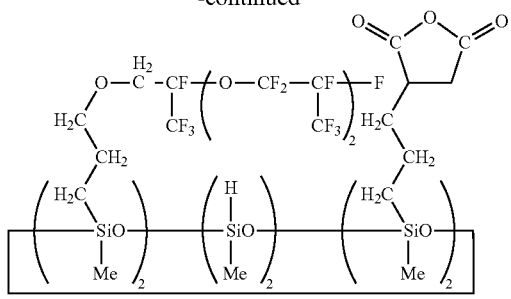

Component (F) may be used a single kind alone or may be used two or more kinds in combination. The formulation amount of the above-mentioned Component (F) is 0.010 to 10.0 parts by mass based on 100 parts by mass of Component (A), preferably in the range of 0.10 to 5.0 parts by mass. When it is 0.010 part by mass or more, a sufficient effect to promote developing adhesiveness of the composition according to the present invention can be obtained, and when it is 10.0 parts by mass or less, there is no fear of worsening fluidity of the composition, and not impair the preservation stability of the composition.

[Other Component]

In the curable composition for encapsulating an optical semiconductor of the present invention, various kinds of formulation agents such as a plasticizer, a viscosity controller, a plasticity imparting agent, an inorganic filler, a reaction controller, and an adhesion promoter other than Component (F) may be added to the above-mentioned Components (A) to (F) to heighten its practicability, if necessary. The formulation amounts of these additives are optional.

As the plasticizer, the viscosity controller and the plasticity imparting agent, the polyfluoro monoalkenyl compound represented by the following formula (12') and/or the linear polyfluoro compound represented by the following formula (13') or (14') may be used in combination, $$Rf^2\text{-}(X')_a\text{CH}=\text{CH}_2 \quad (12')$$

wherein X' and "a" represent the same as explained in the above-mentioned formula (1), and $Rf^2$ is a group represented by the following formula (15'),

(15')

wherein "f'" represents an integer of 1 or more, preferably an integer of 1 to 100, more preferably an integer of 1 to 50, and is smaller than either of p+q (average), the sum of "u" and "s", or the sum of "b" to "d" regarding the $Rf^1$ group of the above-mentioned Component (A); and "h'" represents 2 or 3.

(13')

wherein $Rf^3$ is a group represented by $C_bF_{2b'+1}$— ("b'" is 1 to 3), "c'" represents an integer of 1 to 200, preferably an integer of 2 to 100, and is smaller than either of p+q (average), the sum of "u" and "s", or the sum of "b" to "d" regarding the $Rf^1$ group of the above-mentioned Component (A),

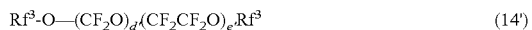
(14')

wherein $Rf^3$ has the same meaning as defined above, "d'" and "e'" represents each an integer of 1 to 200, preferably an integer of 1 to 100, and, the sum of "d'" and "e'" is smaller than either of p+q (average), the sum of "u" and "s", or the sum of "b" to "d" regarding the $Rf^1$ group of the above-mentioned Component (A).

Specific examples of the polyfluoro monoalkenyl compound represented by the above-mentioned formula (12') may be mentioned, for example, the following (incidentally, the following m2 is to satisfy the above-mentioned requirements).

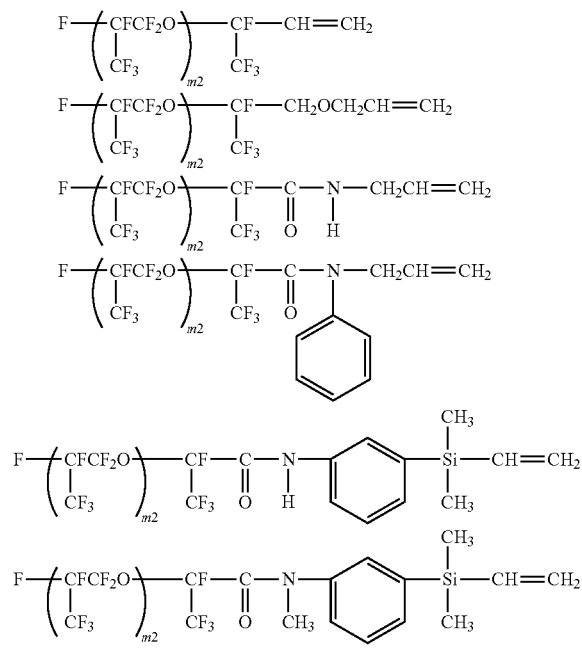

Specific examples of the linear polyfluoro compounds represented by the above-mentioned formula (13') and (14') may be mentioned, for example, the following (incidentally, the following "n3" or a sum of "n3" and "m3" is to satisfy the above-mentioned requirements.),

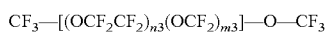

wherein m3+n3=2 to 201, m3=1 to 200, and n3=1 to 200.

The viscosities (at 23° C.) of the polyfluoro compounds represented by the above-mentioned formula (12') to (14') are desirably 5.0 to 100,000 mPa·s, particularly in the range of 50 to 50,000 mPa·s according to the same measurement method as in Component (A).

Examples of the inorganic filler may be mentioned a silica type reinforcing filler including silica powder such as fumed silica, precipitation silica, spherical silica and silica aerogel; or silica powder in which the surface of the above-mentioned silica powder is treated by various kinds of organochlorosilane, organodisilazane or cyclic organopolysilazane; silica powder in which the surface-treated silica powder is further treated again with an organosilane or an organosiloxane having the monovalent perfluoroalkyl group represented by the above mentioned formula (11) or the monovalent perfluorooxyalkyl group represented by the above-mentioned formula (12); a reinforcing or semi-reinforcing filler such as quartz powder, fused quartz powder, diatomaceous earth and calcium carbonate; inorganic pigments such as titanium oxide, iron oxide, carbon black and cobalt aluminate; a heat-resistance improver such as titanium oxide, iron oxide, carbon black, cerium oxide, cerium hydroxide, zinc carbonate, magnesium carbonate and manganese carbonate; a thermal conductivity imparting agent such as alumina, boron nitride, silicon carbide and metal powder; and a conductivity imparting agent such as carbon black, silver powder and conductive zinc oxide. In addition, inorganic fine particles such as magnesium fluoride, aluminum fluoride, calcium fluoride, lithium fluoride, sodium fluoride, thorium fluoride and silicon oxide, each having a refractive index at 25° C. and 589 nm (D line of sodium) of 1.50 or less are useful as the reinforcing filler.

Examples of the controlling agent of the hydrosilylation catalyst may be mentioned an acetylenic alcohol such as 1-ethynyl-1-hydroxycyclohexane, 3-methyl-1-butyn-3-ol, 3,5-dimethyl-1-hexyn-3-ol, 3-methyl-1-penten-3-ol and phenylbutynol; a reaction product of a chlorosilane having a monovalent perfluoroalkyl group or a monovalent perfluorooxyalkyl group which are the same as mentioned in the above substituent A and an acetylenic alcohol; 3-methyl-3-penten-1-yn, 3,5-dimethyl-3-hexen-1-yn, triallylisocyanurate; or polyvinylsiloxane, an organophosphorous compound, etc., and by adding these compounds, curing reactivity and preservation stability can be maintained suitably.

The adhesion promoter other than Component (F) may be mentioned, for example, the following carboxylic acid anhydrides. Incidentally, in the following formulae, "Me" represents a methyl group. These compounds may be used alone or two or more kinds in combination.

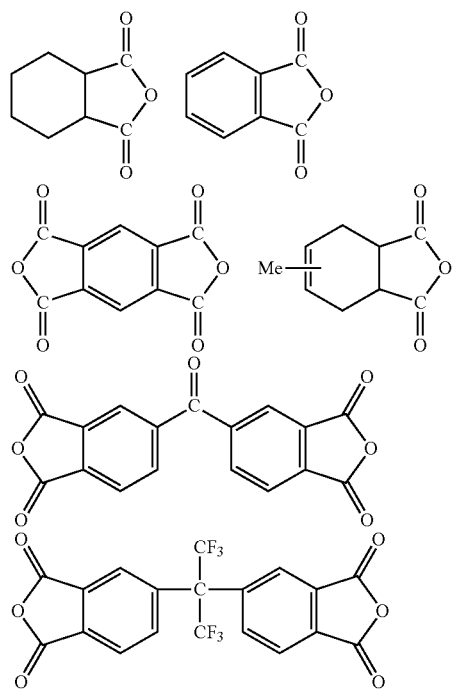

The manufacturing method of the curable composition for encapsulating an optical semiconductor of the present invention is not particularly limited, and it can be manufactured by kneading the above-mentioned Components (A) to (E), Component (F) and other optional component(s) together. At that time, if necessary, a mixing apparatus such as a planetary mixer, a ross mixer and a Hobart mixer; and a mixing and kneading apparatus such as a kneader and a three-roll mill can be used.

With regard to the constitution of the curable composition for encapsulating an optical semiconductor of the present invention, depending on the uses, it may be constituted by the so-called one-liquid type in which all of the above-mentioned Components (A) to (E), Component (F) and other optional component(s) are treated as one composition, or may be constituted by the two-liquids type and both are mixed at the time of use.

The curable composition for encapsulating an optical semiconductor of the present invention cures by heating to have good impact resistance and to show extremely high adhesiveness to a package material such as a polyphthalamide (PPA) and a liquid crystalline polymer (LCP) or to a metal substrate, so that it is useful as an encapsulating agent for protecting an optical semiconductor device such as LED, IC, LSI and organic EL. The curing temperature of the curable composition for encapsulating an optical semiconductor is not particularly limited, and generally at 20 to 250° C., preferably at 40 to 200° C. The curing time of that case may be optionally selected the time that completes the cross-linking reaction and the adhesion reaction with the various kinds of semiconductor package materials, and generally preferably 10 minutes to 10 hours, more preferably 30 minutes to 8 hours.

Type A durometer hardness regulated by JIS K6253-3 of the cured product obtained by curing the composition of the present invention is 30 to 80. If it is less than 30, there is a fear that it is poor in impact resistance as the LED encapsulating agent, while if it exceeds 80, adhesion with the polyphthalamide (PPA) becomes difficult.

The viscosity regulated by JIS K7117-1 at 23° C. of the composition according to the present invention is preferably 100 to 50,000 mPa·s in the point of handling operatability, more preferably 200 to 30,000 mPa·s. When it is 100 mPa·s or more, it is preferred since there is no fear that control of a dispenser which discharges the composition into the LED package with a predetermined amount becomes difficult due to higher fluidity, and when it is 50,000 mPa·s or less, it is preferred since there is no fear of lowering the productivity by taking a time for leveling the composition in the LED package.

Moreover, the refractive index at 25° C. and 589 nm (D line of sodium) of the cured product obtained by curing the composition of the present invention is preferably 1.30 or more and less than 1.40. When the refractive index is within this range, in the optical semiconductor apparatus in which the above-mentioned optical semiconductor device is encapsulated by the cured product obtained by curing the composition of the present invention, it is preferred since there is no fear of lowering an efficiency which can take out the light emitted by the LED outside depending on the design of the optical semiconductor apparatus.

For using the composition of the present invention, the composition may be used by dissolving in a suitable fluorine series solvent, for example, 1,3-bis(trifluoromethyl)benzene, Fluorinert (product of 3M), perfluorobutyl methyl ether, perfluorobutyl ethyl ether, etc., with a desired concentration depending on the uses and the objects.

A structure of the optical semiconductor apparatus which can be used the curable composition for encapsulating an optical semiconductor of the present invention is not particularly limited. The optical semiconductor apparatus of the present invention has an optical semiconductor device, and a cured product obtained by curing the above-mentioned the curable composition for encapsulating an optical semiconductor of the present invention for encapsulating an optical semiconductor device, and its representative sectional structures are shown in FIG. 1 and FIG. 2.

Figure 2:
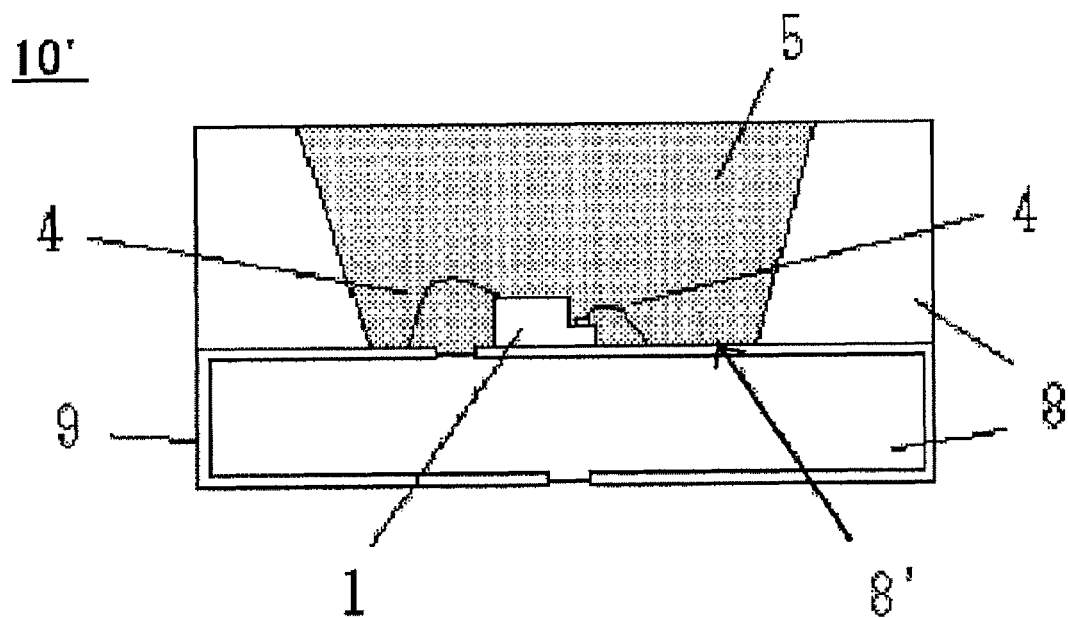
FIG. 2 is a schematic drawing of a cross-sectional view showing other example of the optical semiconductor apparatus of the present invention.

In the optical semiconductor apparatus (light emitting apparatus) 10 of FIG. 1, a conical-shaped concave portion 2' the aperture of which is gradually broaden from the bottom surface to upward is provided at a tip portion 2a of a first lead frame 2, and an LED chip 1 is connected and fixed to the bottom surface of the concave portion 2' through silver paste, etc., by die bonding, whereby the first lead frame 2 and one of an electrode (not shown in the drawing) at the bottom surface of the LED chip 1 are electrically connected. In addition, it comprises a tip portion 3a of a second lead frame 3 and another electrode (not shown in the drawing) at the upper surface of the LED chip 1 being electrically connected through a bonding wire 4.

Moreover, in the above-mentioned concave portion 2', the LED chip 1 is covered by an encapsulating agent 5 comprising the cured product obtained by curing the above-mentioned the curable composition for encapsulating an optical semiconductor of the present invention.

Also, the LED chip 1, the tip portion 2a of the first lead frame 2 and the upper end of a terminal portion 2b, a tip portion 3a of a second lead frame 3 and the upper end of a terminal portion 3b are covered and encapsulated by a transmittant resin portion 7 having a convex lens portion 6 at the tip thereof. The bottom end of the terminal portion 2b of the first lead frame 2 and the bottom end of the terminal portion 3b of the second lead frame 3 are projected outside penetrating through the bottom end portion of the transmittant resin portion 7.

In the optical semiconductor apparatus (light emitting apparatus) 10' of FIG. 2, a conical-shaped concave portion 8' the aperture of which is gradually broaden from the bottom surface to upward is provided at the upper portion of a package substrate 8, and an LED chip 1 is fixed by adhesion to the bottom surface of the concave portion 8' by a die bonding material, and an electrode of the LED chip 1 is electrically connected to an electrode 9 provided to the package substrate 8 by a bonding wire 4.

Further, in the concave portion 8', the LED chip 1 is covered by an encapsulating agent 5 comprising the cured product obtained by curing the above-mentioned the curable composition for encapsulating an optical semiconductor of the present invention.

Here, the above-mentioned LED chip 1 is not particularly limited, and a conventionally known light-emitting device to be used for the LED chip can be used. Such a light-emitting device may be mentioned, for example, a material fabricated by laminating semiconductor materials on a substrate at which a buffer layer such as GaN and AlN is provided, if necessary, by using various kinds of methods such as a MOCVD method, a HDVPE method and a liquid phase growth method. As the substrate in this case, various kinds of materials can be used, and may be mentioned, for example, sapphire, spinel, SiC, Si, ZnO, GaN single crystal, etc. Among these, sapphire is preferably used in the viewpoints of easily forming GaN having good crystallinity and having high industrial value for utilization.

As the semiconductor material to be laminated, there may be mentioned GaAs, GaP, GaAlAs, GaAsP, AlGaInP, GaN, InN, AlN, InGaN, InGaAlN, SiC, etc. Among these, in the view point that high luminance can be obtainable a nitride series compound semiconductor ($In_xGa_yAl_zN$) is preferred. An activator, etc., may be contained in the material.

The structure of the light-emitting device may be mentioned MIS junction, pn junction, homo junction having PIN junction, hetero junction or a double hetero-structure. Also, a single or multiquantam well structure may be employed.

To the light-emitting device may be provided a passivation layer or may not be provided.

The emission wavelength of the light-emitting device may be used various ones from an ultraviolet region to an infrared region, and when the main emission peak wavelength of 550 nm or less is used, the effects of the present invention are particularly remarkable.

The light-emitting device to be used may be subjected to a single-color light emission using one kind, or may be subjected to a single-color or a multi-color light emission using a plural kind.

To the light-emitting device can be formed an electrode by the method conventionally known in the art.

The electrode(s) on the light-emitting device can be electrically connected to a lead terminal(s) by various kinds of methods. The electrically connecting material is preferably a material having good ohmic mechanical connectability with the electrode(s) of the light-emitting device, and may be mentioned, for example, a bonding wire 4 using gold, silver, copper, platinum, aluminum or an alloy thereof as shown in FIG. 1 and FIG. 2. In addition, a conductive adhesive in which a conductive filler such as silver and carbon is filled by a resin may be used. Among these, an aluminum wire or a gold wire is preferably used in the viewpoint of good workability.

The above-mentioned first lead frame 2 and second lead frame 3 are constituted by copper, a copper-zinc alloy, an iron-nickel alloy, etc.

Moreover, a material for forming the above-mentioned transmittant resin portion 7 is not particularly limited so long as it is a material having light transmittance, and an epoxy resin or a silicone resin is mainly used.

Also, the above-mentioned package substrate 8 can be prepared by using various kinds of materials, and may be mentioned, for example, a polyphthalamide (PPA), a polycarbonate resin, a polyphenylene sulfide resin, a polybutylene terephthalate resin, a polyamide resin, a liquid crystalline polymer, an epoxy resin, an acrylic resin, a silicone resin, a modified silicone resin, an ABS resin, a BT resin, ceramic, etc. Among these, heat resistance, in the viewpoints of strength and a cost, a polyphthalamide (PPA) is particularly preferred. Moreover, it is preferred to improve light reflectance by adding a white pigment such as barium titanate, titanium oxide, zinc oxide and barium sulfate to the above-mentioned package substrate 8.

Next, the encapsulating agent 5 to cover the LED chip 1 is a material for transmitting light from the above-mentioned LED chip 1 to outside with good efficiency and for protecting the above-mentioned LED chip 1 or a bonding wire 4 from an external force or dust. As the encapsulating agent 5, the cured product of the composition according to the present invention is used. The encapsulating agent 5 may contain a fluorescent substance or a light diffusing material.

In the curable composition for encapsulating an optical semiconductor of the present invention, the cured product has good impact resistance, so that the optical semiconductor apparatus of the present invention 10 and 10' in which the optical semiconductor device is encapsulated by using the composition of the present invention can be manufactured without damaging the parts.

EXAMPLES

In the following, the present invention is explained in more detail by referring to Examples and Comparative Examples, but the present invention is not limited by the following Examples. Incidentally, in the following examples, "Me" represents a methyl group. In addition, the viscosity is a measured value regulated by JIS K7117-1 at 23° C.

Example 1

To 100 parts by mass of the linear polyfluoro compound (viscosity: 4,010 mPa·s, vinyl group amount: 0.0299 mole/100 g) represented by the following formula (16) were successively added 8.12 parts by mass of the cyclic organopolysiloxane (SiH group amount: 0.00499 mole/g) represented by the following formula (17), 0.15 part by mass of a toluene solution (platinum concentration: 0.5% by mass) containing a platinum-divinyltetramethyldisiloxane complex, 3.0 parts by mass of the cyclic organopolysiloxane represented by the following formula (18), and 2.0 parts by mass of the cyclic organopolysiloxane (vinyl group amount: 0.00531 mole/g) represented by the following formula (19), and mixed uniformly. Thereafter, defoaming operation was carried out to prepare a composition.

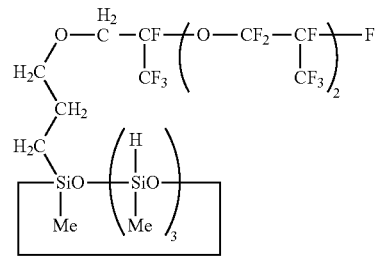
(20)

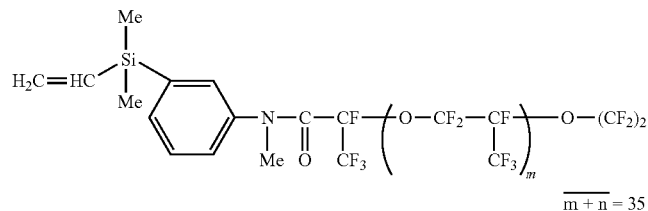
(16)

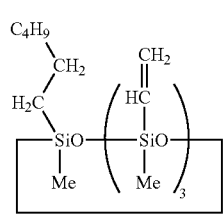
(17)

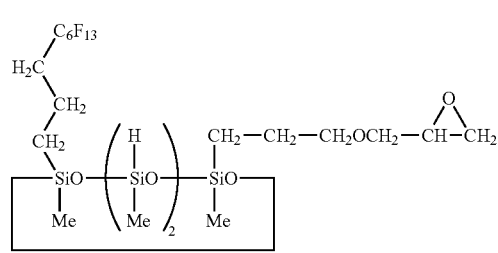
(18)

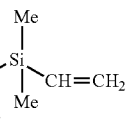
(19)

Example 2

To 100 parts by mass of the linear polyfluoro compound represented by the above-mentioned formula (16) were successively added 10.3 parts by mass of the cyclic organopolysiloxane (SiH group amount: 0.00394 mole/g) represented by the following formula (20), 0.15 part by mass of a toluene solution (platinum concentration: 0.5% by mass) containing a platinum-divinyltetramethyldisiloxane complex, 3.0 parts by mass of the cyclic organopolysiloxane represented by the following formula (21), and 3.0 parts by mass of the cyclic organopolysiloxane (vinyl group amount: 0.00357 mole/g) represented by the following formula (22), and mixed uniformly. Thereafter, defoaming operation was carried out to prepare a composition.

-continued

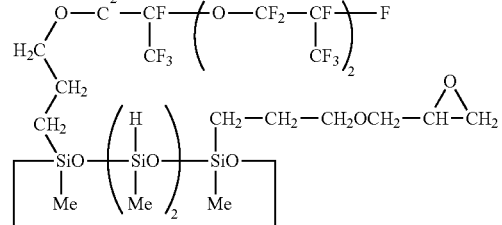
(21)

-continued

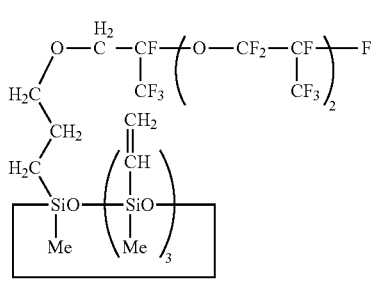
(22)

Example 3

To 100 parts by mass of the linear polyfluoro compound represented by the above-mentioned formula (16) were successively added 6.43 parts by mass of the cyclic organopolysiloxane (SiH group amount: 0.00605 mole/g) represented by the following formula (23), 0.20 part by mass of a toluene solution (platinum concentration: 0.5% by mass) containing a platinum-divinyltetramethyldisiloxane complex, 4.0 parts by mass of the cyclic organopolysiloxane represented by the following formula (24), and 2.0 parts by mass of the cyclic organopolysiloxane (vinyl group amount: 0.00451 mole/g) represented by the following formula (25), and mixed uniformly. Thereafter, defoaming operation was carried out to prepare a composition.

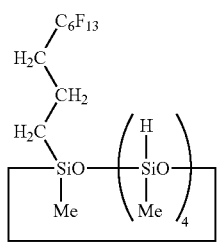
(23)

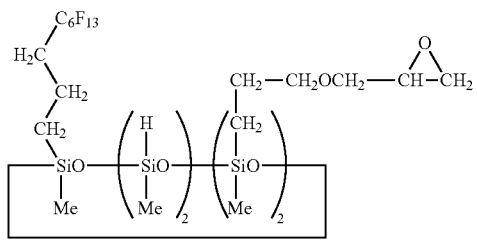
(24)

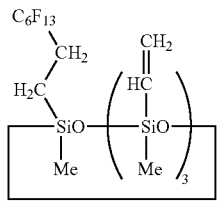
(25)

Example 4

To 100 parts by mass of the linear polyfluoro compound represented by the above-mentioned formula (16) were successively added 8.33 parts by mass of the cyclic organopolysiloxane (SiH group amount: 0.00486 mole/g) represented by the following formula (26), 0.20 part by mass of a toluene solution (platinum concentration: 0.5% by mass) containing a platinum-divinyltetramethyldisiloxane complex, 4.0 parts by mass of the cyclic organopolysiloxane represented by the following formula (27), and 3.0 parts by mass of the cyclic organopolysiloxane (vinyl group amount: 0.00353 mole/g) represented by the following formula (28), and mixed uniformly. Thereafter, defoaming operation was carried out to prepare a composition.

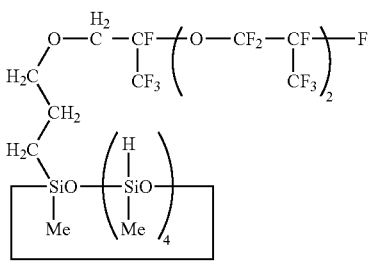
(26)

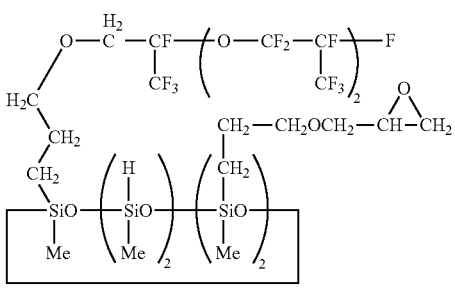
(27)

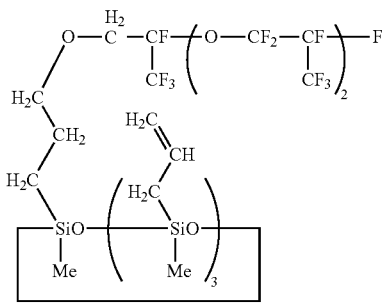
(28)

Example 5

A composition was prepared in the same manner as in Example 3 except for changing the amount of the cyclic organopolysiloxane represented by the above-mentioned formula (23) to 12.4 parts by mass and further the amount of the cyclic organopolysiloxane represented by the above-mentioned formula (25) to 10.0 parts by mass in the above-mentioned Example 3.

Example 6

A composition was prepared in the same manner as in Example 3 except for changing the amount of the cyclic organopolysiloxane represented by the above-mentioned formula (23) to 19.9 parts by mass and further the amount of the cyclic organopolysiloxane represented by the above-mentioned formula (25) to 20.0 parts by mass in the above-mentioned Example 3.

Example 7

A composition was prepared in the same manner as in Example 6 except for using 100 parts by mass of the linear polyfluoro compound (viscosity: 10,900 mPa·s, vinyl group amount: 0.0123 mole/100 g) represented by the following formula (29) in place of the linear polyfluoro compound represented by the above-mentioned formula (16) and changing the amount of the cyclic organopolysiloxane represented by the above-mentioned formula (23) to 16.9 parts by mass in the above-mentioned Example 6.

(29)

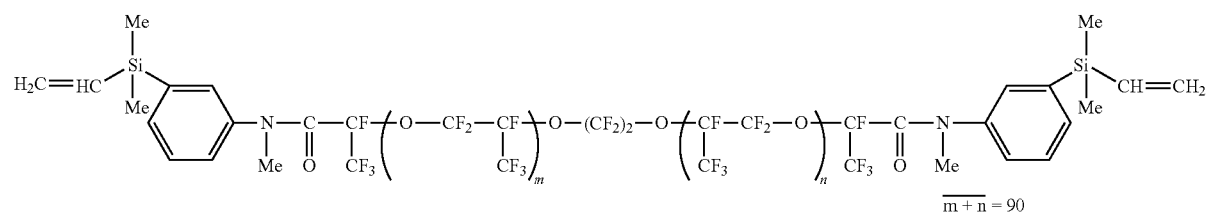

m + n = 90

Example 8

A composition was prepared in the same manner as in Example 6 except for using 100 parts by mass of the linear polyfluoro compound (viscosity: 17,100 mPa·s, vinyl group amount: 0.0091 mole/100 g) represented by the following formula (30) in place of the linear polyfluoro compound represented by the above-mentioned formula (16) and changing the amount of the cyclic organopolysiloxane represented by the above-mentioned formula (23) to 16.4 parts by mass in the above-mentioned Example 6.

(30)

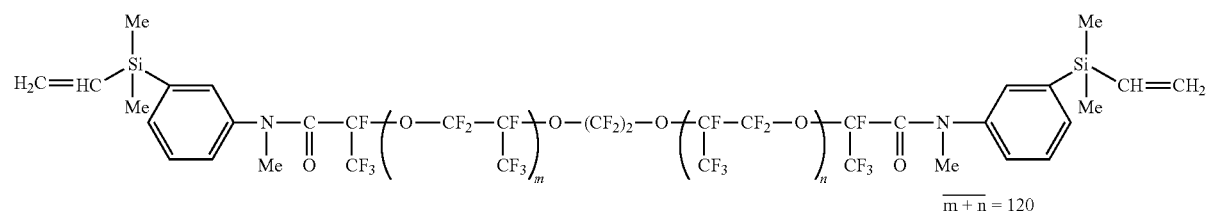

m + n = 120

Example 9

A composition was prepared in the same manner as in Example 6 except for using 100 parts by mass of the linear polyfluoro compound (viscosity: 26,900 mPa·s, vinyl group amount: 0.0070 mole/100 g) represented by the following formula (31) in place of the linear polyfluoro compound represented by the above-mentioned formula (16) and changing the amount of the cyclic organopolysiloxane represented by the above-mentioned formula (23) to 16.1 parts by mass in the above-mentioned Example 6.

(31)

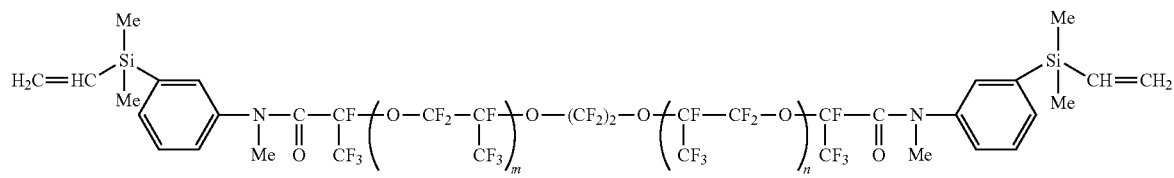

m + n = 150

Example 10

A composition was prepared in the same manner as in Example 7 except for changing the amount of the cyclic organopolysiloxane represented by the above-mentioned formula (23) to 21.4 parts by mass and the amount of the cyclic organopolysiloxane represented by the above-mentioned formula (24) to 5.0 parts by mass, further the amount of the cyclic organopolysiloxane represented by the above-mentioned formula (25) to 26.0 parts by mass in the above-mentioned Example 7.

Example 11

A composition was prepared in the same manner as in Example 8 except for changing the amount of the cyclic organopolysiloxane represented by the above-mentioned formula (23) to 25.4 parts by mass and the amount of the cyclic organopolysiloxane represented by the above-mentioned formula (24) to 6.0 parts by mass, further the amount of the cyclic organopolysiloxane represented by the above-mentioned formula (25) to 32.0 parts by mass in the above-mentioned Example 8.

Example 12

A composition was prepared in the same manner as in Example 9 except for changing the amount of the cyclic organopolysiloxane represented by the above-mentioned formula (23) to 38.4 parts by mass and the amount of the cyclic organopolysiloxane represented by the above-mentioned formula (24) to 8.0 parts by mass, further the amount of the cyclic organopolysiloxane represented by the above-mentioned formula (25) to 50.0 parts by mass in the above-mentioned Example 9.

Example 13

A composition was prepared in the same manner as in Example 3 except for adding 0.50 part by mass of the cyclic organopolysiloxane represented by the following formula (32) in the above-mentioned Example 3.

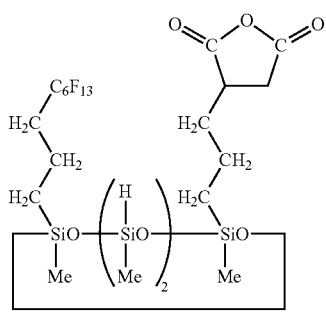

(32)

Example 14

A composition was prepared in the same manner as in Example 5 except for adding 0.80 part by mass of the cyclic organopolysiloxane represented by the following formula (33) in the above-mentioned Example 5.

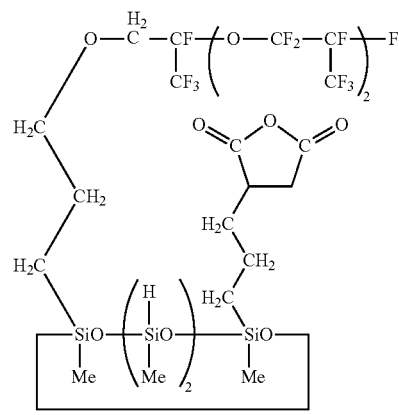

(33)

Example 15

A composition was prepared in the same manner as in Example 6 except for adding 1.0 part by mass of the cyclic organopolysiloxane represented by the following formula (34) in the above-mentioned Example 6.

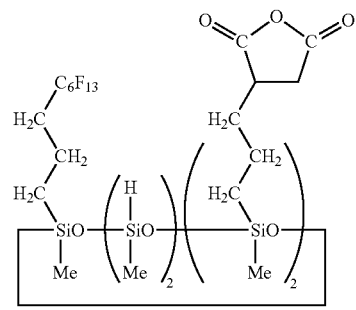

(34)

Example 16

A composition was prepared in the same manner as in Example 7 except for adding 0.80 part by mass of the cyclic organopolysiloxane represented by the following formula (35) in the above-mentioned Example 7.

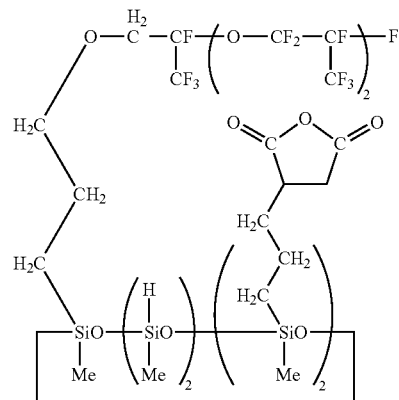

(35)

Example 17

A composition was prepared in the same manner as in Example 8 except for adding 0.7 part by mass of the cyclic organopolysiloxane represented by the above-mentioned formula (34) in the above-mentioned Example 8.

Example 18

A composition was prepared in the same manner as in Example 9 except for adding 0.5 part by mass of the cyclic organopolysiloxane represented by the above-mentioned formula (34) in the above-mentioned Example 9.

Example 19

A composition was prepared in the same manner as in Example 10 except for adding 1.0 part by mass of the cyclic organopolysiloxane represented by the above-mentioned formula (34) in the above-mentioned Example 10.

Example 20

A composition was prepared in the same manner as in Example 11 except for adding 1.3 parts by mass of the cyclic organopolysiloxane represented by the above-mentioned formula (34) in the above-mentioned Example 11.

Example 21

A composition was prepared in the same manner as in Example 12 except for adding 2.0 parts by mass of the cyclic organopolysiloxane represented by the above-mentioned formula (34) in the above-mentioned Example 12.

Example 22

To 100 parts by mass of the linear polyfluoro compound represented by the above-mentioned formula (16) (viscosity: 4,010 mPa·s, vinyl group amount: 0.0299 mole/100 g) were successively added 29.3 parts by mass of the organo hydrogen siloxane (SiH group amount: 0.00210 mole/g) represented by the following formula (40), 0.20 part by mass of a toluene solution (platinum concentration: 0.5% by mass) containing a platinum-divinyltetramethyldisiloxane complex, 3.0 parts by mass of the cyclic organopolysiloxane represented by the above-mentioned formula (24), and 7.0 parts by mass of the cyclic organopolysiloxane (vinyl group amount: 0.00451 mole/g) represented by the above-mentioned formula (25), and mixed uniformly. Thereafter, defoaming operation was carried out to prepare a composition.

Example 23

To 100 parts by mass of the linear polyfluoro compound represented by the above-mentioned formula (16) (viscosity: 4,010 mPa·s, vinyl group amount: 0.0299 mole/100 g) were successively added 31.8 parts by mass of the organo hydrogen siloxane (SiH group amount: 0.00319 mole/g) represented by the following formula (41), 0.20 part by mass of a toluene solution (platinum concentration: 0.5% by mass) containing a platinum-divinyltetramethyldisiloxane complex, 3.0 parts by mass of the cyclic organopolysiloxane represented by the above-mentioned formula (24), and 20.0 parts by mass of the cyclic organopolysiloxane (vinyl group amount: 0.00357 mole/g) represented by the above-mentioned formula (22), and mixed uniformly. Thereafter, defoaming operation was carried out to prepare a composition.

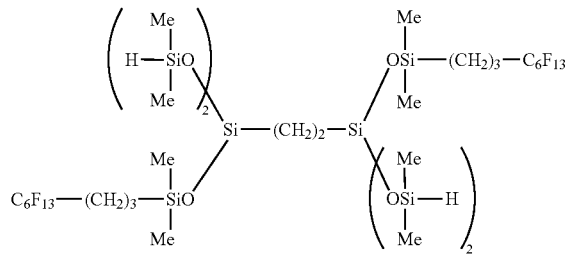

(41)

Example 24

To 100 parts by mass of the linear polyfluoro compound represented by the above-mentioned formula (16) (viscosity: 4,010 mPa·s, vinyl group amount: 0.0299 mole/100 g) were successively added 39.2 parts by mass of the organo hydrogen siloxane (SiH group amount: 0.00322 mole/g) represented by the following formula (42), 0.20 part by mass of a toluene solution (platinum concentration: 0.5% by mass) containing a platinum-divinyltetramethyldisiloxane complex, 3.0 parts by mass of the cyclic organopolysiloxane represented by the above-mentioned formula (27), and 27.0 parts by mass of the cyclic organopolysiloxane (vinyl group amount: 0.00357 mole/g) represented by the above-mentioned formula (22), and mixed uniformly. Thereafter, defoaming operation was carried out to prepare a composition.

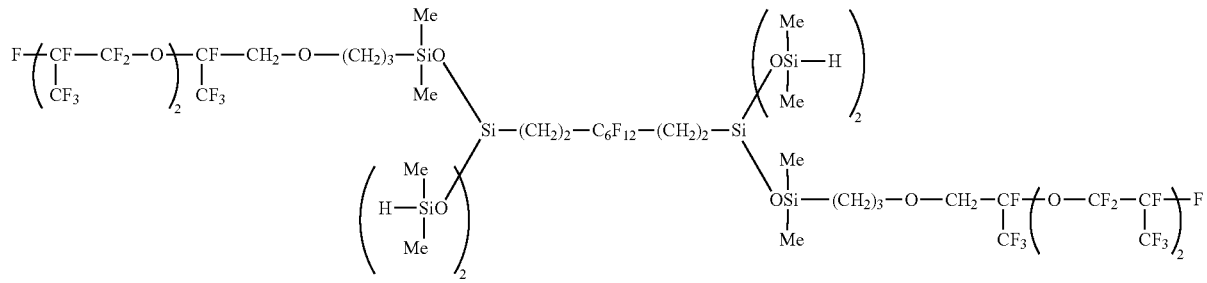

(40)

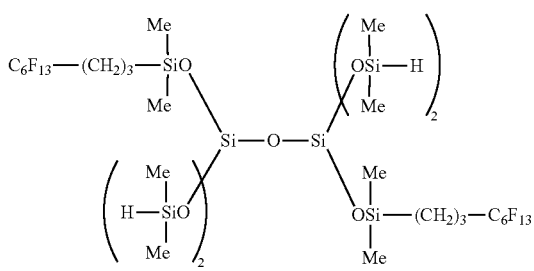

(42)

Example 26

To 100 parts by mass of the linear polyfluoro compound represented by the above-mentioned formula (16) (viscosity: 4,010 mPa·s, vinyl group amount: 0.0299 mole/100 g) were successively added 28.5 parts by mass of the organo hydrogen siloxane (SiH group amount: 0.00356 mole/g) represented by the following formula (44), 0.20 part by mass of a toluene solution (platinum concentration: 0.5% by mass) containing a platinum-divinyltetramethyldisiloxane complex, 3.0 parts by mass of the cyclic organopolysiloxane represented by the above-mentioned formula (27), and 20.0 parts by mass of the cyclic organopolysiloxane (vinyl group amount: 0.00357 mole/g) represented by the above-mentioned formula (22), and mixed uniformly. Thereafter, defoaming operation was carried out to prepare a composition.

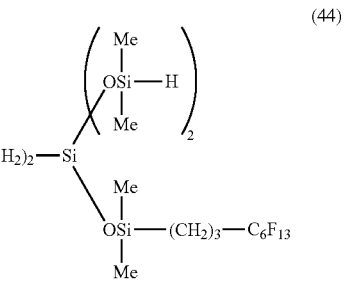

(44)

Example 25

To 100 parts by mass of the linear polyfluoro compound represented by the above-mentioned formula (16) (viscosity: 4,010 mPa·s, vinyl group amount: 0.0299 mole/100 g) were successively added 32.2 parts by mass of the organo hydrogen siloxane (SiH group amount: 0.00315 mole/g) represented by the following formula (43), 0.20 part by mass of a toluene solution (platinum concentration: 0.5% by mass) containing a platinum-divinyltetramethyldisiloxane complex, 3.0 parts by mass of the cyclic organopolysiloxane represented by the above-mentioned formula (27), and 20.0 parts by mass of the cyclic organopolysiloxane (vinyl group amount: 0.00357 mole/g) represented by the above-mentioned formula (22), and mixed uniformly. Thereafter, defoaming operation was carried out to prepare a composition.

Example 27

To 100 parts by mass of the linear polyfluoro compound represented by the above-mentioned formula (16) (viscosity: 4,010 mPa·s, vinyl group amount: 0.0299 mole/100 g) were successively added 10.4 parts by mass of the cyclic organopolysiloxane (SiH group amount: 0.00486 mole/g) represented by the above-mentioned formula (26), 15.9 parts by mass of the organo hydrogen siloxane (SiH group amount: 0.00319 mole/g) represented by the above-mentioned formula (41), 0.20 part by mass of a toluene solution (platinum concentration: 0.5% by mass) containing a platinum-divinyltetramethyldisiloxane complex, 3.0 parts by mass of the cyclic organopolysiloxane represented by the above-mentioned formula (27), and 20.0 parts by mass of the cyclic organopolysiloxane (vinyl group amount: 0.00357 mole/g) represented by the above-mentioned formula (22), and mixed uniformly. Thereafter, defoaming operation was carried out to prepare a composition.

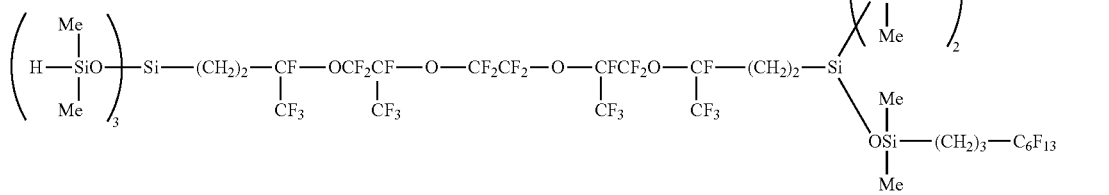

(43)

Example 28

A composition was prepared in the same manner as in Example 22 except for adding 0.30 part by mass of the cyclic organopolysiloxane represented by the above-mentioned formula (34) in the above-mentioned Example 22.

Example 29

A composition was prepared in the same manner as in Example 23 except for adding 0.50 part by mass of the cyclic organopolysiloxane represented by the above-mentioned formula (34) in the above-mentioned Example 23.

Example 30

A composition was prepared in the same manner as in Example 24 except for adding 0.70 part by mass of the cyclic organopolysiloxane represented by the above-mentioned formula (35) in the above-mentioned Example 24.

Example 31

A composition was prepared in the same manner as in Example 25 except for adding 0.50 part by mass of the cyclic organopolysiloxane represented by the above-mentioned formula (35) in the above-mentioned Example 25.

Example 32

A composition was prepared in the same manner as in Example 26 except for adding 0.50 part by mass of the cyclic organopolysiloxane represented by the above-mentioned formula (35) in the above-mentioned Example 26.

Example 33

A composition was prepared in the same manner as in Example 27 except for adding 0.50 part by mass of the cyclic organopolysiloxane represented by the above-mentioned formula (35) in the above-mentioned Example 27.

Comparative Example 1

A composition was prepared in the same manner as in Example 1 except for changing an amount of the cyclic organopolysiloxane represented by the above-mentioned formula (17) to 5.99 parts by mass and further omitting the cyclic organopolysiloxane represented by the above-mentioned formula (19) in the above-mentioned Example 1.

Comparative Example 2

A composition was prepared in the same manner as in Example 2 except for changing an amount of the cyclic organopolysiloxane represented by the above-mentioned formula (20) to 7.59 parts by mass and further omitting the cyclic organopolysiloxane represented by the above-mentioned formula (22) in the above-mentioned Example 2.

Comparative Example 3

A composition was prepared in the same manner as in Example 7 except for changing an amount of the cyclic organopolysiloxane represented by the above-mentioned formula (23) to 2.03 parts by mass and further omitting the cyclic organopolysiloxane represented by the above-mentioned formula (25) in the above-mentioned Example 7.

Comparative Example 4

A composition was prepared in the same manner as in Example 8 except for changing an amount of the cyclic organopolysiloxane represented by the above-mentioned formula (23) to 1.50 parts by mass and further omitting the cyclic organopolysiloxane represented by the above-mentioned formula (25) in the above-mentioned Example 8.

Comparative Example 5

A composition was prepared in the same manner as in Example 9 except for changing an amount of the cyclic organopolysiloxane represented by the above-mentioned formula (23) to 1.16 parts by mass and further omitting the cyclic organopolysiloxane represented by the above-mentioned formula (25) in the above-mentioned Example 9.

Comparative Example 6

A composition was prepared in the same manner as in Example 9 except for changing an amount of the cyclic organopolysiloxane represented by the above-mentioned formula (23) to 54.8 parts by mass and further changing an amount of the cyclic organopolysiloxane represented by the above-mentioned formula (25) to 72.0 parts by mass in the above-mentioned Example 9.

Comparative Example 7

A composition was prepared in the same manner as in Example 9 except for changing an amount of the cyclic organopolysiloxane represented by the above-mentioned formula (23) to 54.8 parts by mass, and changing an amount of the cyclic organopolysiloxane represented by the above-mentioned formula (25) to 72.0 parts by mass, further adding 3.0 parts by mass of the cyclic organopolysiloxane represented by the above-mentioned formula (34) in the above-mentioned Example 9.

Comparative Example 8

A composition was prepared in the same manner as in Example 22 except for changing an amount of the cyclic organopolysiloxane represented by the above-mentioned formula (40) to 14.2 parts by mass and further omitting the cyclic organopolysiloxane represented by the above-mentioned formula (25) in the above-mentioned Example 22.

Comparative Example 9

A composition was prepared in the same manner as in Example 24 except for changing an amount of the cyclic organopolysiloxane represented by the above-mentioned formula (42) to 62.5 parts by mass, and changing an amount of the cyclic organopolysiloxane represented by the above-mentioned formula (22) to 48.0 parts by mass, further adding 2.0 parts by mass of the cyclic organopolysiloxane represented by the above-mentioned formula (35) in the above-mentioned Example 24.

With regard to each composition, evaluations on the following items were carried out. The curing conditions are at 150° C. for 5 hours. The results are all shown in Table 1.

1. Viscosity of composition: according to JIS K7117-1, measured at 23° C.
2. Hardness: a sheet state cured product having a thickness of 2 mm was prepared, and measured according to JIS K6253-3.
3. Refractive index: a sheet state cured product having a thickness of 2 mm was prepared, and measured the refractive index by using a multi-wavelength Abbe's refractometer DR-M2/1550 (product of ATAGO CO., LTD.) at 25° C. and 589 nm (D line of sodium).
4. Adhesiveness to polyphthalamide (PPA): A layer of the composition with a thickness of 80 μm obtained as mentioned above was sandwiched between two sheets of the test panels made of PPA with a size of 100 mm×25 mm so as to overlap the respective edge portions of the panels with each 10 mm, and the composition was cured by heating at 150° C. for 5 hours to prepare an adhered test piece. Then, the test piece was subjected to a tensile shear adhesion test (tensile speed: 50 mm/min) to evaluate an adhesive strength (shear adhesive force) and a cohesive failure rate.
5. Impact resistance of cured product: in the optical semiconductor apparatus having the same constitution as shown in the shape of FIG. 2, the composition obtained as mentioned above for forming the encapsulating agent 5 was injected into the concave portion 8' so that the LED chip 1 was dipped, and heated at 150° C. for 5 hours to fabricate an optical semiconductor apparatus in which the LED chip 1 had been encapsulated by the cured product of the composition. Then, a thousand of the optical semiconductor apparatuses were aligned by applying them to a bowl type vibration parts feeder, and then, a number of the apparatuses in which the bonding wire was disconnected were counted.

TABLE 1

|  | Example 1 | Example 2 | Example 3 | Example 4 | Example 5 |
|---|---|---|---|---|---|
| Viscosity/mPa·s | 2,680 | 2,520 | 2,750 | 2,600 | 873 |
| Hardness (Type A durometer) | 30 | 30 | 35 | 34 | 55 |
| Refractive index | 1.34 | 1.34 | 1.34 | 1.34 | 1.36 |
| PPA shear adhesive force/MPa | 1.0 | 1.0 | 1.2 | 1.2 | 1.5 |
| PPA cohesive failure rate/% | 100 | 100 | 100 | 100 | 90 |
| Number of disconnected wire/number | 0 | 0 | 0 | 0 | 0 |

|  | Example 6 | Example 7 | Example 8 | Example 9 | Example 10 |
|---|---|---|---|---|---|
| Viscosity/mPa·s | 307 | 6,820 | 15,700 | 25,800 | 4,770 |
| Hardness (Type A durometer) | 80 | 65 | 57 | 48 | 80 |
| Refractive index | 1.38 | 1.35 | 1.33 | 1.31 | 1.37 |
| PPA shear adhesive force/MPa | 1.8 | 1.6 | 1.5 | 1.3 | 1.6 |
| PPA cohesive failure rate/% | 80 | 85 | 90 | 90 | 80 |
| Number of disconnected wire/number | 0 | 0 | 0 | 0 | 0 |

TABLE 1-continued

|  | Example 11 | Example 12 | Example 13 | Example 14 | Example 15 |
|---|---|---|---|---|---|
| Viscosity/mPa·s | 11,100 | 16,300 | 2,670 | 753 | 280 |
| Hardness (Type A durometer) | 79 | 80 | 35 | 54 | 77 |
| Refractive index | 1.36 | 1.35 | 1.34 | 1.36 | 1.38 |
| PPA shear adhesive force/MPa | 1.5 | 1.5 | 1.3 | 1.7 | 2.1 |
| PPA cohesive failure rate/% | 80 | 80 | 100 | 100 | 100 |
| Number of disconnected wire/number | 0 | 0 | 0 | 0 | 0 |

|  | Example 16 | Example 17 | Example 18 | Example 19 | Example 20 |
|---|---|---|---|---|---|
| Viscosity/mPa·s | 6,010 | 15,300 | 25,600 | 4,180 | 10,500 |
| Hardness (Type A durometer) | 64 | 55 | 45 | 78 | 77 |
| Refractive index | 1.35 | 1.33 | 1.31 | 1.37 | 1.36 |
| PPA shear adhesive force/MPa | 1.8 | 1.7 | 1.5 | 2.0 | 1.9 |
| PPA cohesive failure rate/% | 100 | 100 | 100 | 100 | 100 |
| Number of disconnected wire/number | 0 | 0 | 0 | 0 | 0 |

|  | Example 21 | Example 22 | Example 23 | Example 24 | Example 25 |
|---|---|---|---|---|---|
| Viscosity/mPa·s | 16,000 | 495 | 289 | 234 | 270 |
| Hardness (Type A durometer) | 76 | 31 | 51 | 60 | 53 |
| Refractive index | 1.35 | 1.35 | 1.37 | 1.37 | 1.37 |
| PPA shear adhesive force/MPa | 2.0 | 1.1 | 1.4 | 1.5 | 1.4 |
| PPA cohesive failure rate/% | 100 | 100 | 90 | 90 | 90 |
| Number of disconnected wire/number | 0 | 0 | 0 | 0 | 0 |

|  | Example 26 | Example 27 | Example 28 | Example 29 | Example 30 |
|---|---|---|---|---|---|
| Viscosity/mPa·s | 295 | 313 | 463 | 245 | 171 |
| Hardness (Type A durometer) | 55 | 55 | 30 | 50 | 58 |
| Refractive index | 1.37 | 1.37 | 1.35 | 1.37 | 1.37 |
| PPA shear adhesive force/MPa | 1.4 | 1.5 | 1.3 | 1.6 | 1.7 |

TABLE 1-continued

| | | | | | |
|---|---|---|---|---|---|
| PPA cohesive failure rate/% | 90 | 90 | 100 | 100 | 100 |
| Number of disconnected wire/number | 0 | 0 | 0 | 0 | 0 |

| | Example 31 | Example 32 | Example 33 |
|---|---|---|---|
| Viscosity/mPa · s | 228 | 257 | 268 |
| Hardness (Type A durometer) | 52 | 54 | 54 |
| Refractive index | 1.37 | 1.37 | 1.37 |
| PPA shear adhesive force/MPa | 1.6 | 1.6 | 1.7 |
| PPA cohesive failure rate/% | 100 | 100 | 100 |
| Number of disconnected wire/number | 0 | 0 | 0 |

TABLE 2

| | Comparative Example 1 | Comparative Example 2 | Comparative Example 3 | Comparative Example 4 |
|---|---|---|---|---|
| Viscosity/mPa · s | 3,050 | 2,910 | 9,980 | 16,500 |
| Hardness (Type A durometer) | 27 | 27 | 22 | 18 |
| Refractive index | 1.34 | 1.34 | 1.33 | 1.32 |
| PPA shear adhesive force/MPa | 0.8 | 0.8 | 0.7 | 0.5 |
| PPA cohesive failure rate/% | 100 | 100 | 100 | 100 |
| Number of disconnected wire/number | 9 | 11 | 24 | 44 |

| | Comparative Example 5 | Comparative Example 6 | Comparative Example 7 | Comparative Example 8 |
|---|---|---|---|---|
| Viscosity/mPa · s | 26,500 | 9,830 | 9,640 | 1,190 |
| Hardness (Type A durometer) | 14 | 90 | 84 | 25 |
| Refractive index | 1.30 | 1.38 | 1.38 | 1.34 |
| PPA shear adhesive force/MPa | 0.4 | 0.7 | 0.9 | 0.8 |
| PPA cohesive failure rate/% | 100 | 20 | 30 | 100 |
| Number of disconnected wire/number | 62 | 0 | 0 | 18 |

| | Comparative Example 9 |
|---|---|
| Viscosity/mPa · s | 103 |
| Hardness (Type A durometer) | 82 |
| Refractive index | 1.38 |
| PPA shear adhesive force/MPa | 0.9 |
| PPA cohesive failure rate/% | 30 |
| Number of disconnected wire/number | 0 |

From the results shown in Table 1 and Table 2, the cured products obtained by curing the curable compositions for encapsulating an optical semiconductor of the present invention (Examples 1 to 33) had good impact resistance and good adhesiveness to the PPA as compared with Comparative Examples 1 to 9, and no disconnection of the bonding wire was observed. From these results, the optical semiconductor apparatus can be manufactured without damaging the parts such as disconnection of the bonding wire even when the optical semiconductor apparatuses are collided to each other during the manufacturing step by using the curable composition for encapsulating an optical semiconductor of the present invention as the encapsulating agent of the optical semiconductor device.

It must be stated here that the present invention is not restricted to the embodiments shown by the above-mentioned Examples. The embodiments shown by the above-mentioned Examples are merely examples so that any embodiments composed of substantially the same technical concept as disclosed in the claims of the present invention and expressing a similar effect are included in the technical scope of the present invention.

What is claimed is:

1. A curable composition for encapsulating an optical semiconductor which comprises (A) 100 parts by mass of a linear polyfluoro compound represented by the following formula (1),

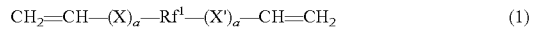

$$CH_2=CH-(X)_a-Rf^1-(X')_a-CH=CH_2 \qquad (1)$$

wherein X is a group represented by any one of $-CH_2-$, $-CH_2O-$, $-CH_2OCH_2-$ and $-Y-NR^1-CO-$;

where Y represents $-CH_2-$ or an o-, m- or p-dimethylsilylphenylene group represented by the following structural formula (2),

(2)

and $R^1$ represents a hydrogen atom, or an unsubstituted or substituted monovalent hydrocarbon group;

X' is a group represented by any one of $-CH_2-$, $-OCH_2-$, $-CH_2OCH_2-$ and $-CO-NR^1-Y'-$;

where Y' is a group represented by any one of $-CH_2-$ or an o-, m- or p-dimethylsilylphenylene group represented by the following structural formula (3),

(3)

and $R^1$ represents the same group as mentioned above;

"a" represents independently 0 or 1; $Rf^1$ represents a divalent perfluoropolyether group represented by the following formula (4) or (5),

$$-C_tF_{2t}(OCF_2CF)_pOCF_2(CF_2)_rCF_2O(CFCF_2O)_qC_tF_{2t}- \qquad (4)$$

wherein "p" and "q" represents each an integer of 1 to 150, and an average of the sum of "p" and "q" represents 2 to 300; "r" represents an integer of 0 to 6; and t represents 2 or 3,

$$—C_tF_{2t}(OCFCF_2)_u(OCF_2)_sOC_tF_{2t}— \quad (5)$$

with $CF_3$ on the branch.

wherein "u" represents an integer of 1 to 300; "s" represents an integer of 1 to 80; and "t" has the same meaning as defined above, (B) a cyclic organopolysiloxane represented by the following formula (6), having a hydrogen atom directly bonded to a silicon atom, and a monovalent perfluoroalkyl group or a monovalent perfluorooxyalkyl group each bonded to a silicon atom through a divalent hydrocarbon group which may contain an oxygen atom or a nitrogen atom in the molecule, and/or an organo hydrogen siloxane represented by the following formula (36), having a hydrogen atom directly bonded to a silicon atom, and a monovalent perfluoroalkyl group or a monovalent perfluorooxyalkyl group each bonded to a silicon atom through a divalent hydrocarbon group which may contain an oxygen atom or a nitrogen atom in the molecule,

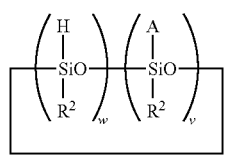

(6)

wherein "w" represents an integer of 3 to 6; "v" represents an integer of 1 to 4; w+v represents an integer of 4 to 10; $R^2$ represents a substituted or unsubstituted monovalent hydrocarbon group; and A represents a monovalent perfluoroalkyl group or a monovalent perfluorooxyalkyl group each bonded to a silicon atom through a divalent hydrocarbon group which may contain an oxygen atom or a nitrogen atom,

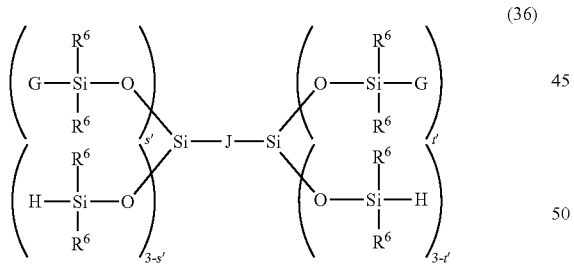

(36)

wherein J represents a divalent perfluoroalkylene group or a divalent perfluorooxyalkylene group each bonded to a silicon atom through an oxygen atom, an alkylene group, or a divalent hydrocarbon group which may contain an oxygen atom or a nitrogen atom; G independently represents a monovalent perfluoroalkyl group or a monovalent perfluorooxyalkyl group each bonded to a silicon atom through a divalent hydrocarbon group which may contain an oxygen atom or a nitrogen atom; $R^6$ independently represents a substituted or unsubstituted monovalent hydrocarbon group; "s'" represents 0 or an integer of 1 to 3; "t'" represents 0 or an integer of 1 to 3; and s'+t' represents an integer of 1 to 5, (C) 0.1 to 500 ppm of a platinum group metal catalyst in terms of a platinum group metal atom, (D) 0.10 to 10.0 parts by mass of a cyclic organopolysiloxane represented by the following formula (7), having a hydrogen atom directly bonded to a silicon atom, a monovalent perfluoroalkyl group or a monovalent perfluorooxyalkyl group each bonded to a silicon atom through a divalent hydrocarbon group which may contain an oxygen atom or a nitrogen atom, and an epoxy group bonded to a silicon atom through a divalent hydrocarbon group which may contain an oxygen atom in the molecule,

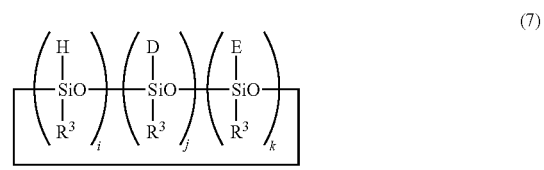

(7)

wherein "i" represents an integer of 1 to 6; "j" represents an integer of 1 to 4; "k" is an integer of 1 to 4; i+j+k represents an integer of 4 to 10; $R^3$ represents a substituted or unsubstituted monovalent hydrocarbon group;

D represents a monovalent perfluoroalkyl group or a monovalent perfluorooxyalkyl group each bonded to a silicon atom through a divalent hydrocarbon group which may contain an oxygen atom or a nitrogen atom; and E represents an epoxy group bonded to a silicon atom through a divalent hydrocarbon group which may contain an oxygen atom, and (E) 0.10 to 70.0 parts by mass of a cyclic organopolysiloxane represented by the following formula (8), having a monovalent unsaturated hydrocarbon group directly bonded to a silicon atom, and a monovalent perfluoroalkyl group or a monovalent perfluorooxyalkyl group each bonded to a silicon atom through a divalent hydrocarbon group which may contain an oxygen atom or a nitrogen atom in the molecule,

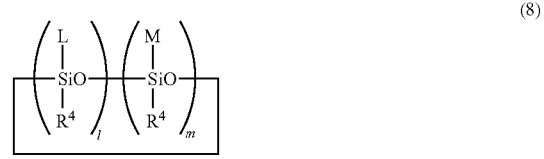

(8)

wherein "l" represents an integer of 1 to 4; "m" represents an integer of 3 to 6; l+m represents an integer of 4 to 10; $R^4$ represents a substituted or unsubstituted monovalent hydrocarbon group; L represents a monovalent perfluoroalkyl group or a monovalent perfluorooxyalkyl group each bonded to a silicon atom through a divalent hydrocarbon group which may contain an oxygen atom or a nitrogen atom; and M represents a monovalent unsaturated hydrocarbon group directly bonded to a silicon atom, wherein the above-mentioned Component (B) is contained in such an amount that the hydrogen atom directly bonded to a silicon atom becomes 0.1 to 2.0 mole based on 1 mole of the sum of the alkenyl group of the above-mentioned Component (A) and the monovalent unsaturated hydrocarbon group of the above-mentioned Component (E), and a hardness of a cured product obtained by curing the composition is a value of 30 to 80 by Type A durometer regulated by JIS K6253-3.

2. The curable composition for encapsulating an optical semiconductor according to claim 1, wherein the composition further comprises as Component (F), 0.010 to 10.0 parts by mass of a cyclic organopolysiloxane represented by the following formula (9), having a hydrogen atom directly bonded to a silicon atom, a monovalent perfluoroalkyl group or a monovalent perfluorooxyalkyl group each bonded to a silicon atom through a divalent hydrocarbon group which may contain an oxygen atom or a nitrogen atom, and a cyclic carboxylic acid anhydride residue bonded to a silicon atom through a divalent hydrocarbon group in the molecule,

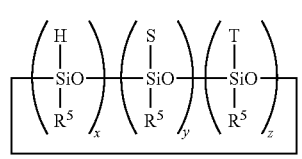

(9)

wherein "x" represents an integer of 1 to 6; "y" represents an integer of 1 to 4; "z" is an integer of 1 to 4; x+y+z represents an integer of 4 to 10; $R^5$ represents a substituted or unsubstituted monovalent hydrocarbon group; S represents a monovalent perfluoroalkyl group or a monovalent perfluorooxyalkyl group each bonded to a silicon atom through a divalent hydrocarbon group which may contain an oxygen atom or a nitrogen atom; and T represents a cyclic carboxylic acid anhydride residue bonded to a silicon atom through a divalent hydrocarbon group.

3. The curable composition for encapsulating an optical semiconductor according to claim 1, wherein a viscosity regulated by JIS K7117-1 at 23° C. of the curable composition for encapsulating an optical semiconductor is 100 to 50,000 mPa·s.

4. The curable composition for encapsulating an optical semiconductor according to claim 2, wherein a viscosity regulated by JIS K7117-1 at 23° C. of the curable composition for encapsulating an optical semiconductor is 100 to 50,000 mPa·s.

5. The curable composition for encapsulating an optical semiconductor according to claim 1, wherein a refractive index of a cured product obtained by curing the curable composition for encapsulating an optical semiconductor at 25° C. and 589 nm which is a D line of sodium is 1.30 or more and less than 1.40.

6. The curable composition for encapsulating an optical semiconductor according to claim 2, wherein a refractive index of a cured product obtained by curing the curable composition for encapsulating an optical semiconductor at 25° C. and 589 nm which is a D line of sodium is 1.30 or more and less than 1.40.

7. The curable composition for encapsulating an optical semiconductor according to claim 3, wherein a refractive index of a cured product obtained by curing the curable composition for encapsulating an optical semiconductor at 25° C. and 589 nm which is a D line of sodium is 1.30 or more and less than 1.40.

8. The curable composition for encapsulating an optical semiconductor according to claim 4, wherein a refractive index of a cured product obtained by curing the curable composition for encapsulating an optical semiconductor at 25° C. and 589 nm which is a D line of sodium is 1.30 or more and less than 1.40.

9. The curable composition for encapsulating an optical semiconductor according to claim 1 wherein Component (A) is a compound represented by the following formula (10),

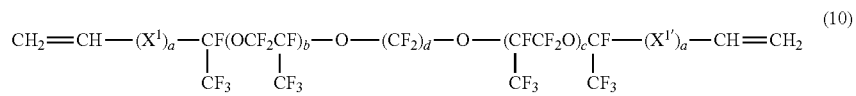

(10)

wherein $X^1$ has the same meaning as in the above-mentioned X; $X^{1'}$ has the same meaning as in the above-mentioned X'; "a" independently represents 0 or 1; "d" represents an integer of 2 to 6; "b" and "c" represent each an integer of 1 to 150; and b+c represents 2 to 300 in an average.

10. The curable composition for encapsulating an optical semiconductor according to claim 2 wherein Component (A) is a compound represented by the following formula (10),

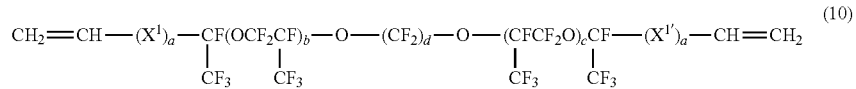

(10)

wherein $X^1$ has the same meaning as in the above-mentioned X; $X^{1'}$ has the same meaning as in the above-mentioned X'; "a" independently represents 0 or 1; "d" represents an integer of 2 to 6; "b" and "c" represent each an integer of 1 to 150; and b+c represents 2 to 300 in an average.

11. The curable composition for encapsulating an optical semiconductor according to claim 3 wherein Component (A) is a compound represented by the following formula (10),

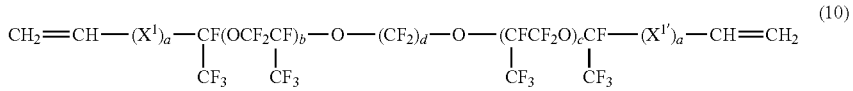

wherein $X^1$ has the same meaning as in the above-mentioned X; $X^{1\prime}$ has the same meaning as in the above-mentioned X'; "a" independently represents 0 or 1; "d" represents an integer of 2 to 6; "b" and "c" represent each an integer of 1 to 150; and b+c represents 2 to 300 in an average.

12. The curable composition for encapsulating an optical semiconductor according to claim 5 wherein Component (A) is a compound represented by the following formula (10),

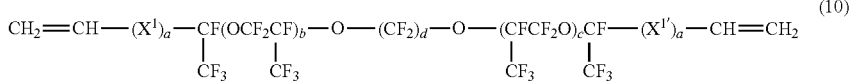

wherein $X^1$ has the same meaning as in the above-mentioned X; $X^{1\prime}$ has the same meaning as in the above-mentioned X'; "a" independently represents 0 or 1; "d" represents an integer of 2 to 6; "b" and "c" represent each an integer of 1 to 150; and b+c represents 2 to 300 in an average.

13. The curable composition for encapsulating an optical semiconductor according to claim 1, wherein an alkenyl group content of the linear polyfluoro compound of Component (A) is 0.0050 to 0.100 mole/100 g.

14. The curable composition for encapsulating an optical semiconductor according to claim 2, wherein an alkenyl group content of the linear polyfluoro compound of Component (A) is 0.0050 to 0.100 mole/100 g.

15. The curable composition for encapsulating an optical semiconductor according to claim 3, wherein an alkenyl group content of the linear polyfluoro compound of Component (A) is 0.0050 to 0.100 mole/100 g.

16. The curable composition for encapsulating an optical semiconductor according to claim 5, wherein an alkenyl group content of the linear polyfluoro compound of Component (A) is 0.0050 to 0.100 mole/100 g.

17. The curable composition for encapsulating an optical semiconductor according to claim 9, wherein an alkenyl group content of the linear polyfluoro compound of Component (A) is 0.0050 to 0.100 mole/100 g.

18. The curable composition for encapsulating an optical semiconductor according to claim 1, wherein the monovalent perfluoroalkyl group or a monovalent perfluorooxyalkyl group possessed by Component (B), Component (D), Component (E) and Component (F) are each represented by the following formula (11) or the following formula (12),

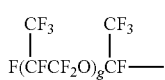 (11)

wherein f represents an integer of 1 to 10,

 (12)

wherein "g" represents an integer of 1 to 10.

19. The curable composition for encapsulating an optical semiconductor according to claim 2, wherein the monovalent perfluoroalkyl group or a monovalent perfluorooxyalkyl group possessed by Component (B), Component (D), Component (E) and Component (F) are each represented by the following formula (11) or the following formula (12),

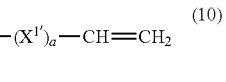 (11)

wherein f represents an integer of 1 to 10,

 (12)

wherein "g" represents an integer of 1 to 10.

20. The curable composition for encapsulating an optical semiconductor according to claim 3, wherein the monovalent perfluoroalkyl group or a monovalent perfluorooxyalkyl group possessed by Component (B), Component (D), Component (E) and Component (F) are each represented by the following formula (11) or the following formula (12), $C_fF_{2f+1}$— (11)

wherein f represents an integer of 1 to 10,

 (12)

wherein "g" represents an integer of 1 to 10.

21. The curable composition for encapsulating an optical semiconductor according to claim 5, wherein the monovalent perfluoroalkyl group or a monovalent perfluorooxyalkyl group possessed by Component (B), Component (D), Component (E) and Component (F) are each represented by the following formula (11) or the following formula (12), $C_fF_{2f+1}$— (11)

wherein f represents an integer of 1 to 10,

 (12)

wherein "g" represents an integer of 1 to 10.

22. The curable composition for encapsulating an optical semiconductor according to claim 9, wherein the monovalent perfluoroalkyl group or a monovalent perfluorooxyalkyl group possessed by Component (B), Component (D), Component (E) and Component (F) are each represented by the following formula (11) or the following formula (12), $$C_fF_{2f+1}— \tag{11}$$

wherein f represents an integer of 1 to 10, $$F(\overset{CF_3}{\underset{|}{C}}FCF_2O)_g\overset{CF_3}{\underset{|}{C}}F— \tag{12}$$

wherein "g" represents an integer of 1 to 10.

23. The curable composition for encapsulating an optical semiconductor according to claim 13, wherein the monovalent perfluoroalkyl group or a monovalent perfluorooxyalkyl group possessed by Component (B), Component (D), Component (E) and Component (F) are each represented by the following formula (11) or the following formula (12), $$C_fF_{2f+1}— \tag{11}$$

wherein f represents an integer of 1 to 10, $$F(\overset{CF_3}{\underset{|}{C}}FCF_2O)_g\overset{CF_3}{\underset{|}{C}}F— \tag{12}$$

wherein "g" represents an integer of 1 to 10.

24. An optical semiconductor apparatus comprising an optical semiconductor device and a cured product obtained in curing the curable composition for encapsulating an optical semiconductor according to claim 1 for encapsulating the optical semiconductor device.

25. The optical semiconductor apparatus according to claim 24, wherein the optical semiconductor device is a light emitting diode.

* * * * *